(12) United States Patent
Honda et al.

(10) Patent No.: US 11,398,515 B2
(45) Date of Patent: Jul. 26, 2022

(54) SOLID-STATE IMAGING ELEMENT, METHOD FOR MANUFACTURING THE SAME, AND ELECTRONIC APPARATUS

(71) Applicant: SONY CORPORATION, Tokyo (JP)

(72) Inventors: Hideyuki Honda, Kanagawa (JP); Tetsuya Uchida, Kanagawa (JP); Toshifumi Wakano, Kanagawa (JP); Yusuke Tanaka, Kanagawa (JP); Yoshiharu Kudoh, Kanagawa (JP); Hirotoshi Nomura, Kanagawa (JP); Tomoyuki Hirano, Kanagawa (JP); Shinichi Yoshida, Kanagawa (JP); Yoichi Ueda, Kanagawa (JP); Kosuke Nakanishi, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/877,304

(22) Filed: May 18, 2020

(65) Prior Publication Data
US 2020/0286937 A1    Sep. 10, 2020

Related U.S. Application Data

(63) Continuation of application No. 15/737,402, filed as application No. PCT/JP2017/014753 on Apr. 11, 2017, now Pat. No. 10,700,114.

(30) Foreign Application Priority Data

Apr. 25, 2016  (JP) ................. 2016-087158

(51) Int. Cl.
*H01L 27/146*     (2006.01)
*H01L 21/76*      (2006.01)
(Continued)

(52) U.S. Cl.
CPC .......... *H01L 27/1463* (2013.01); *H01L 21/76* (2013.01); *H01L 27/146* (2013.01);
(Continued)

(58) Field of Classification Search
CPC ........ H04N 5/365; H04N 5/369; H04N 5/376; H04N 5/378; H01L 21/76; H01L 27/146;
(Continued)

(56) References Cited

U.S. PATENT DOCUMENTS 7,652,313 B2    1/2010  Ellis-Monaghan et al.
8,101,450 B1*   1/2012  Doan ............... H01L 27/14689
                                                    438/57
(Continued)

FOREIGN PATENT DOCUMENTS

JP    2011-159757    8/2011
JP    4987917        8/2012
(Continued)

OTHER PUBLICATIONS

International Search Report and Written Opinion for International (PCT) Patent Application No. PCT/JP2017/014753, dated Jun. 20, 2017, 9 pages.

(Continued)

*Primary Examiner* — Chiawei Chen
(74) *Attorney, Agent, or Firm* — Sheridan Ross P.C.

(57) ABSTRACT

The present technology relates to a solid-state imaging element configured so that pixels can be more reliably separated, a method for manufacturing the solid-state imaging element, and an electronic apparatus.

The solid-state imaging element includes a photoelectric converter, a first separator, and a second separator. The photoelectric converter is configured to perform photoelectric conversion of incident light. The first separator configured to separate the photoelectric converter is formed in a (Continued)

first trench formed from a first surface side. The second separator configured to separate the photoelectric converter is formed in a second trench formed from a second surface side facing a first surface. The present technology is applicable to an individual imaging element mounted on, e.g., a camera and configured to acquire an image of an object.

20 Claims, 38 Drawing Sheets

(51) Int. Cl.
| | |
|---|---|
| H04N 5/369 | (2011.01) |
| H04N 5/365 | (2011.01) |
| H04N 5/378 | (2011.01) |
| H04N 5/376 | (2011.01) |

(52) U.S. Cl.
CPC .... *H01L 27/1464* (2013.01); *H01L 27/14603* (2013.01); *H01L 27/14614* (2013.01); *H01L 27/14621* (2013.01); *H01L 27/14627* (2013.01); *H01L 27/14641* (2013.01); *H01L 27/14689* (2013.01); *H04N 5/365* (2013.01); *H04N 5/369* (2013.01); *H04N 5/378* (2013.01); *H01L 27/14636* (2013.01); *H01L 27/14645* (2013.01); *H01L 27/14685* (2013.01); *H04N 5/376* (2013.01)

(58) Field of Classification Search
CPC ......... H01L 27/14603; H01L 27/14614; H01L 27/14621; H01L 27/14627; H01L 27/1463; H01L 27/14636; H01L 27/1464; H01L 27/14641; H01L 27/14645; H01L 27/14685; H01L 27/14689; H01L 5/365; H01L 5/369; H01L 5/376; H01L 5/378

See application file for complete search history.

(56) References Cited

U.S. PATENT DOCUMENTS

| | | | |
|---|---|---|---|
| 8,941,198 B2 | 1/2015 | Enomoto | |
| 9,419,039 B2 | 8/2016 | Ahmed et al. | |
| 10,115,759 B2 | 10/2018 | Lee et al. | |
| 10,163,949 B2 | 12/2018 | Lai et al. | |
| 10,700,114 B2 | 6/2020 | Honda et al. | |
| 2001/0015435 A1* | 8/2001 | Suzuki | H01L 27/14689 257/1 |
| 2007/0187734 A1* | 8/2007 | Adkisson | H01L 27/1463 257/293 |
| 2010/0026866 A1 | 2/2010 | Matsumoto et al. | |
| 2010/0060758 A1* | 3/2010 | Oshiyama | H01L 27/14683 348/294 |
| 2010/0117126 A1 | 5/2010 | Takahashi | |
| 2010/0127314 A1 | 5/2010 | Frach | |
| 2010/0128161 A1 | 5/2010 | Yamaguchi | |
| 2011/0156186 A1* | 6/2011 | Iida | H01L 27/1464 257/432 |
| 2011/0181749 A1 | 7/2011 | Yamada | |
| 2012/0025199 A1 | 2/2012 | Chen et al. | |
| 2012/0080733 A1* | 4/2012 | Doan | H01L 27/1463 257/292 |
| 2012/0217601 A1 | 8/2012 | Miyanami | |
| 2013/0193547 A1* | 8/2013 | Nakazawa | H01L 31/18 257/443 |
| 2013/0241023 A1 | 9/2013 | Nishizawa et al. | |
| 2013/0307040 A1* | 11/2013 | Ahn | H01L 27/1463 257/292 |
| 2014/0054662 A1 | 2/2014 | Yanagita et al. | |
| 2014/0078359 A1* | 3/2014 | Lenchenkov | H01L 27/1463 348/294 |
| 2014/0131779 A1 | 5/2014 | Takeda | |
| 2014/0160335 A1 | 6/2014 | Shimotsusa | |
| 2014/0246707 A1* | 9/2014 | Koo | H01L 27/14614 257/230 |
| 2015/0002718 A1 | 1/2015 | Nomura | |
| 2015/0061062 A1 | 3/2015 | Lin et al. | |
| 2015/0076572 A1* | 3/2015 | Sakurano | H01L 27/14609 257/291 |
| 2015/0122973 A1 | 5/2015 | Kim et al. | |
| 2015/0162418 A1 | 6/2015 | Meiser et al. | |
| 2015/0243700 A1 | 8/2015 | Morooka | |
| 2015/0279878 A1* | 10/2015 | Ahmed | H01L 27/14685 257/446 |
| 2016/0043120 A1* | 2/2016 | Ahn | H01L 27/14614 257/229 |
| 2016/0064430 A1 | 3/2016 | Lee et al. | |
| 2016/0118422 A1 | 4/2016 | Takeda | |
| 2016/0126271 A1 | 5/2016 | Sakurano et al. | |
| 2016/0343751 A1 | 11/2016 | Sze et al. | |
| 2016/0343752 A1* | 11/2016 | Tsai | H01L 27/1464 |
| 2017/0047367 A1 | 2/2017 | Lee et al. | |
| 2017/0078539 A1 | 3/2017 | Madurawe et al. | |
| 2017/0098680 A1* | 4/2017 | Roh | H01L 27/14623 |
| 2017/0186788 A1 | 6/2017 | Yen et al. | |
| 2018/0359434 A1 | 12/2018 | Tanaka et al. | |

FOREIGN PATENT DOCUMENTS

| | | |
|---|---|---|
| JP | 2013-157422 | 8/2013 |
| JP | 2013-175494 | 9/2013 |
| JP | 2014-096490 | 5/2014 |
| JP | 2015-012126 | 1/2015 |
| JP | 2015-153772 | 8/2015 |
| JP | 2015-162603 | 9/2015 |
| KR | 10-2012-0036263 | 4/2012 |
| KR | 10-2014-0015326 | 2/2014 |

OTHER PUBLICATIONS

Notice of Allowance (with English translation) for Korea Patent Application No. 10-2017-7035069, dated Jan. 23, 2022, 4 pages.

* cited by examiner

SOLID-STATE IMAGING ELEMENT, METHOD FOR MANUFACTURING THE SAME, AND ELECTRONIC APPARATUS

CROSS REFERENCE TO RELATED APPLICATIONS

This application is a continuation of U.S. patent application Ser. No. 15/737,402 filed Dec. 18, 2017 which is a national stage application under 35 U.S.C. 371 and claims the benefit of PCT Application No. PCT/JP2017/014753 having an international filing date of 11 Apr. 2017, which designated the United States, which PCT application claimed the benefit of Japanese Patent Application No. 2016-087158 filed 25 Apr. 2016, the disclosures of which are incorporated herein by reference in their entirety.

TECHNICAL FIELD

The present technology relates to a solid-state imaging element, a method for manufacturing the solid-state imaging element, and an electronic apparatus. Specifically, the present technology relates to a solid-state imaging element configured so that pixels can be more reliably separated, the method for manufacturing the solid-state imaging element, and the electronic apparatus.

BACKGROUND ART

In a solid-state imaging element, a plurality of pixels are arranged. Thus, for preventing color mixture, photoelectric converters forming adjacent pixels need to be separated, and various proposals have been made for such a demand.

For example, Patent Document 1 proposes that a separation structure is formed before formation of photodiodes and a P-type impurity is diffused on a trench surface by a solid-phase diffusion technique to form a P-type diffusion layer.

Moreover, Patent Document 2 proposes that a trench is formed from a light receiving surface side and pixels are separated together with a P-type impurity between photodiodes.

Further, Patent Document 3 proposes that a trench is formed at the periphery of a photodiode and a PN joint is formed at a side wall of the trench. In this manner, an electric field of a peripheral portion is intensified, and a saturated charge amount Qs is increased. A P-type impurity layer is formed by ion implantation or solid-phase diffusion, and an N-type impurity layer is formed by ion implantation.

CITATION LIST

Patent Document

Patent Document 1: Japanese Patent No. 4987917
Patent Document 2: Japanese Patent Application Laid-Open No. 2013-157422
Patent Document 3: Japanese Patent Application Laid-Open No. 2015-153772

SUMMARY OF THE INVENTION

Problems to be Solved by the Invention

However, in the proposal of Patent Document 1, there is restriction on a pixel transistor area in a fine pixel, and offset needs to be made in a depth direction. For these reasons, sufficient separation by a trench structure is difficult.

In the proposal of Patent Document 2, high-heat treatment cannot be used because a trench structure is formed after formation of the photodiodes. For this reason, it is difficult to perform additional impurity processing, and a P-type diffusion layer needs to be formed on a trench surface in advance.

In the proposal of Patent Document 3, the N-type impurity is formed by ion implantation. For this reason, the impurity expands in a transverse direction, and therefore, a steep PN joint cannot be formed. Thus, there are limitations on electric field intensification and improvement of the saturated charge amount Qs.

As a result, it is difficult to sufficiently separate pixels by these proposals.

The present technology has been made in view of these situations, and is intended to more reliably separate pixels.

Solutions to Problems

One aspect of the present technology is a solid-state imaging element including: a photoelectric converter configured to perform photoelectric conversion of incident light; a first separator configured to separate the photoelectric converter and formed in a first trench formed from a first surface side; and a second separator configured to separate the photoelectric converter and formed in a second trench formed from a second surface side facing a first surface.

In the first trench, a first impurity layer formed of an N-type impurity and a second impurity layer formed of a P-type impurity may be formed by solid-phase diffusion.

The first separator and the second separator may be arranged next to each other in a direction parallel to an optical axis of a lens through which light enters the photoelectric converter.

The photoelectric converter may include photoelectric converters in two tiers, the photoelectric converter on the first surface side being separated by the first separator and the photoelectric converter on the second surface side being separated by the second separator.

A periphery of a block including 2×2 photoelectric converters may be separated by the first separator.

The first separator and the second separator may be arranged next to each other in a direction perpendicular to an optical axis of a lens through which light enters the photoelectric converter.

In the first trench, a first impurity layer formed of an N-type impurity, a second impurity layer formed of a P-type impurity, and a thermally-oxidized film may be formed.

A wiring layer may be disposed on the first surface side of a semiconductor layer having the photoelectric converter, the first separator, and the second separator, and an optical layer may be disposed on the second surface side.

One aspect of the present technology is a method for manufacturing a solid-state imaging element, including: a step of forming a first trench from a first surface side; a step of forming, in the first trench, a first separator for separating a photoelectric converter; a step of forming a second trench from a second surface side facing a first surface; and a step of forming, in the second trench, a second separator for separating the photoelectric converter.

One aspect of the present technology is an electronic apparatus including: a solid-state imaging element configured to acquire an image of an object; and a signal processor configured to process an image signal output from the solid-state imaging element, in which the solid-state imaging element includes a photoelectric converter configured to perform photoelectric conversion of incident light, a first separator configured to separate the photoelectric converter and formed in a first trench formed from a first surface side, and a second separator configured to separate the photoelectric converter and formed in a second trench formed from a second surface side facing a first surface.

One aspect of the present technology is a solid-state imaging element including: a photoelectric converter configured to perform photoelectric conversion of incident light; and a separator configured to separate the photoelectric converter, in which the separator includes N-type and P-type impurity layers formed in a trench for separating the photoelectric converter, and a thermally-oxidized film formed on the impurity layers.

The impurity layers may be formed by solid-phase diffusion.

The N-type impurity layer may be formed only on a transfer gate side in the trench, and may not be formed on an opposite side of the transfer gate.

An embedded film to which a predetermined voltage is to be applied may be embedded in the trench.

A fixed charge film with a negative fixed charge may be formed on the thermally-oxidized film.

The separator may be formed surrounding a periphery of a pixel.

The trench may be formed from a first surface side of a semiconductor layer having the photoelectric converter and the separator, a wiring layer being disposed on the first surface side, and an optical layer may be disposed on a second surface side facing a first surface.

The impurity layers may be formed by tilt ion implantation, plasma doping, epitaxial growth, or vapor-phase diffusion.

In one aspect of the present technology, the photoelectric converter is configured to perform photoelectric conversion of incident light through the lens, the wiring layer is configured such that a line for transmitting/receiving a signal to/from the photoelectric converter is disposed on the opposite side of the lens, and the separators are configured such that adjacent photoelectric converters are separated by the first separator in the first trench formed from the side on which the wiring layer is disposed and the second separator in the second trench formed from the side on which the lens is disposed.

Effects of the Invention

As described above, according to one aspect of the present technology, the pixels can be more reliably separated. Note that the advantageous effects described in the present specification are mere examples, and are not limited. Moreover, additional advantageous effects may be provided.

MODE FOR CARRYING OUT THE INVENTION

Modes for carrying out the present technology will be described below. Note that description will be made in the following order.

Figure 1:
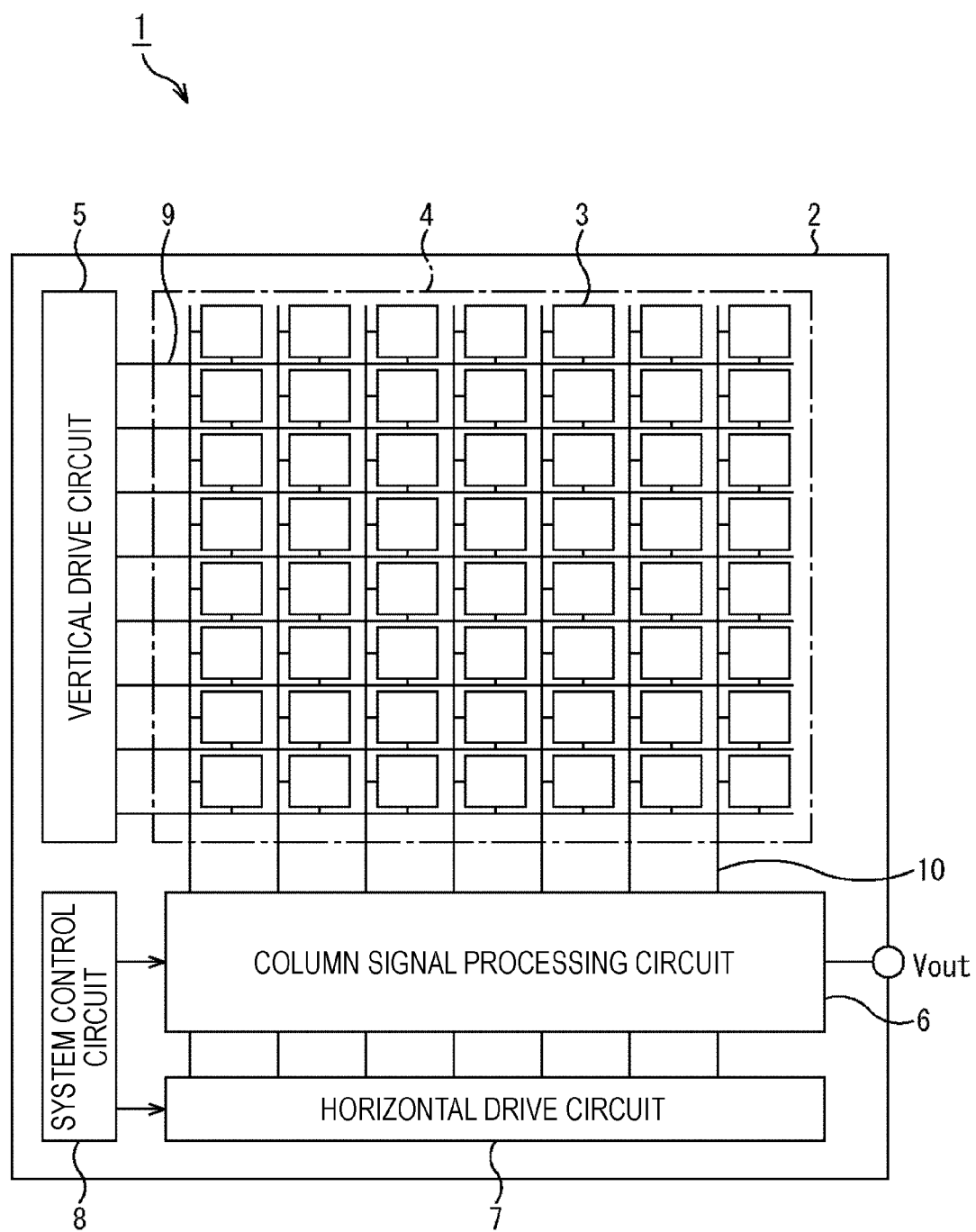
FIG. 1 is a view of a configuration of a solid-state imaging element of a first embodiment of the present technology.

1. First Embodiment: Combination of FDTI and RDTI (FIG. 1 to FIG. 25)
 (1) Outline Configuration Example of Solid-State Imaging Element (FIG. 1)
 (2) Configuration of Combination of FDTI and RDTI (FIG. 2, FIG. 10, FIG. 11)
 (3) Method for Manufacturing Solid-State Imaging Element (FIG. 3 to FIG. 9)
 (4) Configuration 1 of Another Combination of FDTI and RDTI (FIG. 12, FIG. 13)
 (5) Configuration 2 of Still Another Combination of FDTI and RDTI (FIG. 14, FIG. 15)
 (6) Configuration 3 of Still Another Combination of FDTI and RDTI (FIG. 16, FIG. 17)
 (7) Configuration 4 of Still Another Combination of FDTI and RDTI (FIG. 18, FIG. 19)
 (8) Configuration 5 of Still Another Combination of FDTI and RDTI (FIG. 20, FIG. 21)
 (9) Configuration 6 of Still Another Combination of FDTI and RDTI (FIG. 22, FIG. 23)
 (10) Configuration 7 of Still Another Combination of FDTI and RDTI (FIG. 24, FIG. 25)
2. Second Embodiment: FDTI (FIG. 26 to FIG. 41)
 (1) Configuration of FDTI (FIG. 26, FIG. 27, FIG. 28)
 (2) Method for Manufacturing FDTI (FIG. 29, FIG. 30, FIG. 31)
 (3) Another Configuration 1 of FDTI (FIG. 32)
 (4) Still Another Configuration 2 of FDTI (FIG. 33)
 (5) Still Another Configuration 3 of FDTI (FIG. 34)
 (6) Still Another Configuration 4 of FDTI (FIG. 35)
 (7) Still Another Configuration 5 of FDTI (FIG. 36)
 (8) Still Another Configuration 6 of FDTI (FIG. 37)
 (9) Still Another Configuration 7 of FDTI (FIG. 38)
 (10) Still Another Configuration 8 of FDTI (FIG. 39)
 (11) Another Method for Manufacturing FDTI (FIG. 40, FIG. 41)
3. Third Embodiment: (Electronic apparatus Using Solid-State Imaging Element) (FIG. 42)
4. Other First Embodiment (Combination of FDTI and RDTI)
(1) Outline Configuration Example of Solid-State Imaging Element FIG. 1 is a view of a configuration of a solid-state imaging element of a first embodiment of the present technology. FIG. 1 illustrates an outline configuration of a metal oxide semiconductor (MOS) type solid-state imaging element as an example of a solid-state imaging element provided with the solid-state imaging element of the present technology.

The solid-state imaging element 1 illustrated in this figure has a pixel region 4 where a plurality of pixels 3 each including a photoelectric conversion region are two-dimensionally arranged on one surface of a support substrate 2. Each pixel 3 disposed in the pixel region 4 is provided with a pixel circuit including, for example, the photoelectric conversion region, a floating diffusion, a reading gate, multiple other transistors (so-called MOS transistors), and a capacitive element. Note that the plurality of pixels 3 may sometimes share part of the pixel circuit.

A peripheral portion of the pixel region 4 described above is provided with peripheral circuits such as a vertical drive circuit 5, column signal processing circuits 6, a horizontal drive circuit 7, and a system control circuit 8.

The vertical drive circuit 5 includes, for example, a shift resistor. The vertical drive circuit 5 is configured to select a pixel drive line 9 to supply the selected pixel drive line 9 with a pulse for driving the pixels 3, thereby driving, in units of rows, the pixels 3 arranged in the pixel region 4. That is, the vertical drive circuit 5 selectively and sequentially scans each pixel in the vertical direction in units of rows, each pixel being disposed in the pixel region 4. Then, a pixel signal based on a signal charge generated according to a received light amount in each pixel 3 is supplied to the column signal processing circuit 6 via a vertical drive line 10 disposed perpendicular to the pixel drive line 9.

The column signal processing circuit 6 is disposed for each column of the pixels, for example. The column signal processing circuit 6 is configured to perform, for each pixel column, signal processing of signals output from a single line of pixels 3, such as noise removal. That is, the column signal processing circuit 6 performs the signal processing for removing pixel-specific fixed pattern noise, such as correlated double sampling (CDS), signal amplification, or analog/digital conversion (AD).

The horizontal drive circuit 7 includes, for example, a shift resistor. The horizontal drive circuit 7 is configured to sequentially output a horizontal scanning pulse to sequentially select each of the column signal processing circuits 6, thereby causing each of the column signal processing circuits 6 to output the pixel signals.

The system control circuit 8 is configured to receive an input clock and data for commanding an operation mode etc. and to output data such as internal information of the solid-state imaging element 1. That is, in the system control circuit 8, a clock signal and a control signal as a reference of operation of the vertical drive circuit 5, the column signal processing circuits 6, the horizontal drive circuit 7, etc. are generated on the basis of a vertical synchronization signal, a horizontal synchronization signal, and a master clock. Then, these signals are input to the vertical drive circuit 5, the column signal processing circuits 6, the horizontal drive circuit 7, etc.

Each peripheral circuit and the pixel circuit provided in the pixel region 4 as described above form a drive circuit configured to drive each pixel. Note that the peripheral circuits may be arranged at positions stacked on the pixel region 4.

(2) Configuration of Combination of FDTI and RDTI

Figure 2:
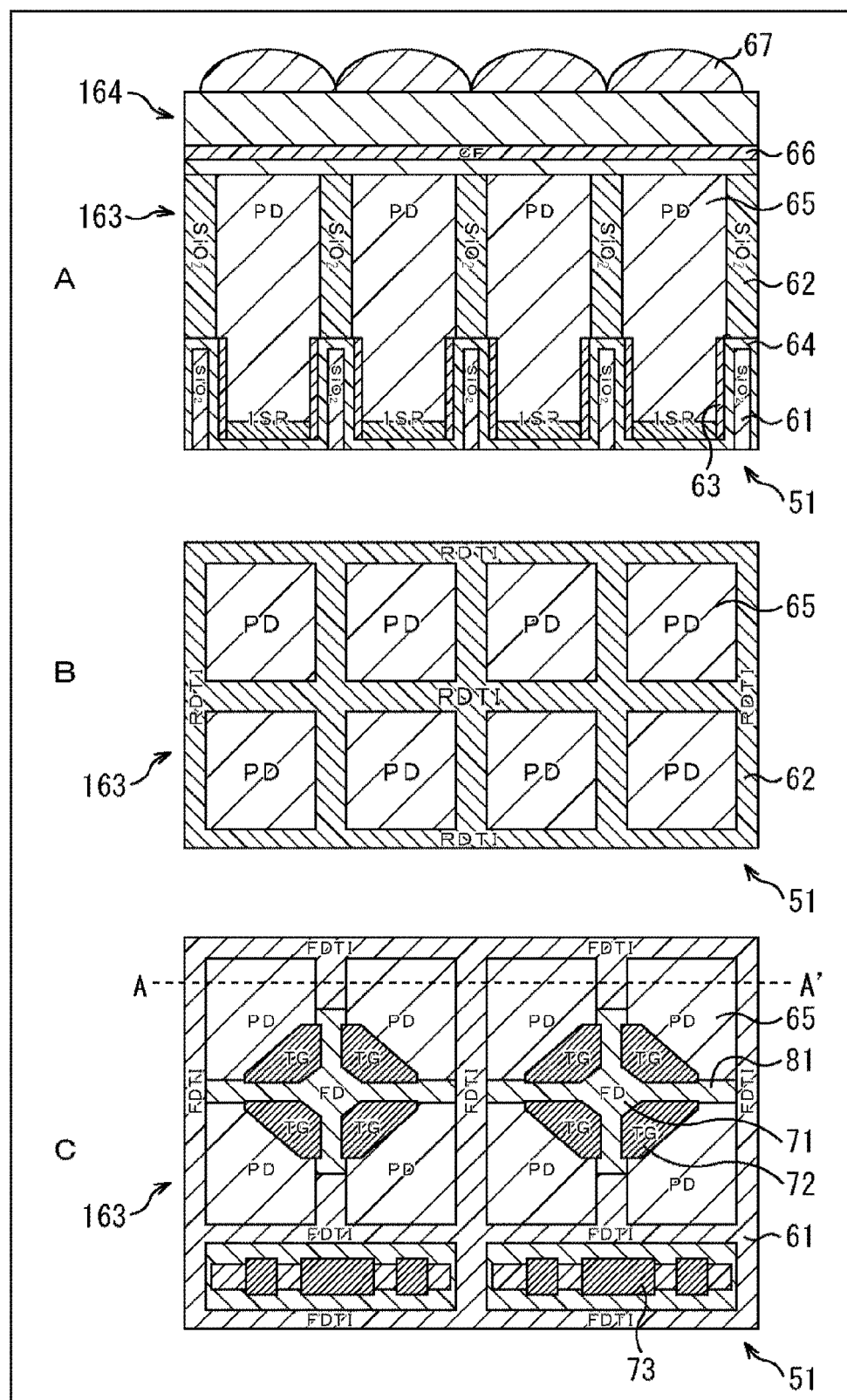
FIG. 2 is a view of the configuration of the solid-state imaging element of the first embodiment of the present technology.

FIG. 2 is a view of the configuration of the solid-state imaging element of the first embodiment of the present technology. A configuration of a combination of a front deep trench isolation (FDTI) and a rear deep trench isolation (RDTI) of the solid-state imaging element 1 will be mainly described below with reference to FIG. 2.

FIG. 2 illustrates a configuration of a solid-state imaging element 51 as part of the solid-state imaging element 1 of FIG. 1. B and C of FIG. 2 respectively illustrate configurations of back and front surfaces of the solid-state imaging element 51, and A of FIG. 2 illustrates a configuration of a cross section of the solid-state imaging element 51 along an A-A' line of C of FIG. 2.

A of FIG. 2 illustrates a state in which an optical layer 164 having a color filter 66 and lenses 67 is disposed on an upper side (a back surface side) of a semiconductor layer 163 and nothing is disposed on a lower side (a front surface side). However, it is actually configured such that a wiring layer 162 is disposed on a first surface side (the front surface side) of the semiconductor layer 163 and the optical layer 164 is disposed on a second surface side (the back surface side) facing a first surface as illustrated in B of FIG. 7 described later. That is, the solid-state imaging element 1 is a solid-state imaging element represented by a backside illumination type complementary metal oxide semiconductor (CMOS) image sensor.

The semiconductor layer 163 is provided with photodiodes 65 as photoelectric converters. The lenses 67 are arranged corresponding respectively to the photodiodes 65. The photodiode 65 is configured to perform photoelectric conversion of light input through the optical layer 164, i.e., the lens 67 and the color filter 66, and corresponding to a color of the color filter 66. In the semiconductor layer 163, each photodiode 65 is separated by a FDTI 61 and a RDTI 62 as separators.

Figure 7:
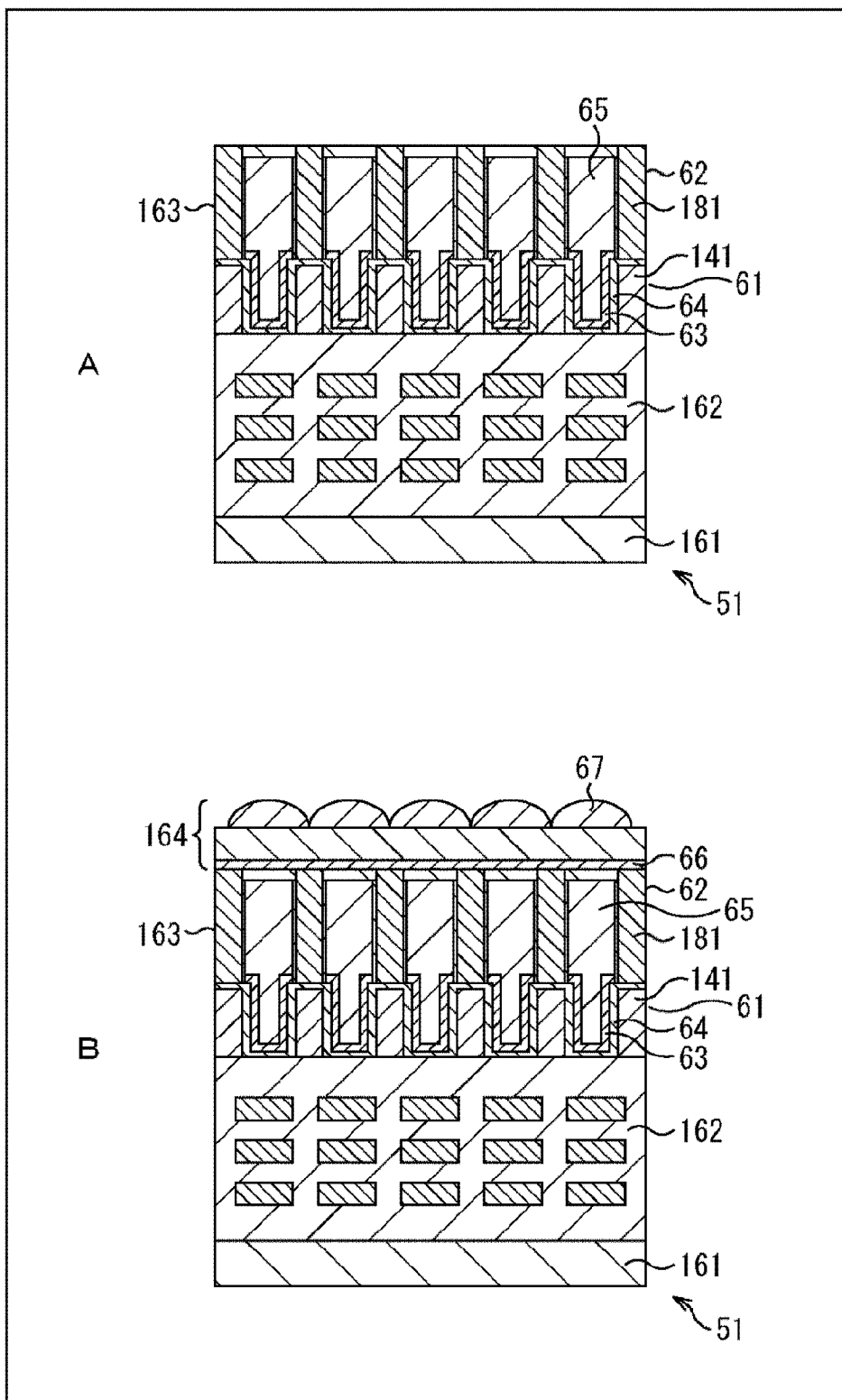
FIG. 7 is a view for describing the method for manufacturing the solid-state imaging element of the first embodiment of the present technology.

The FDTI 61 as a first separator is a separator formed on the basis of a trench (a trench 111 of B of FIG. 4 described later) formed from the front surface side of the solid-state imaging element 51. That is, the FDTI 61 is a separator formed on the basis of a trench formed from the front surface (a surface on the lower side as viewed in A of FIG. 2, i.e., a surface opposite to a surface on which the lenses 67 are arranged, i.e., a side on which the later-described wiring layer 162 illustrated in B of FIG. 7 is disposed) of the solid-state imaging element 51. The trench forming the FDTI 61 has, on a surface thereof, an impurity layer 63 formed of an N-type impurity, and an impurity layer 64 formed of a P-type impurity.

Conversely, the RDTI 62 as a second separator is a separator formed on the basis of a trench (a trench 171 of D of FIG. 6 described later) formed from the back surface (a surface on the upper side as viewed in A of FIG. 2, i.e., the surface on the side on which the lenses 67 are arranged) of the solid-state imaging element 51.

As illustrated in A of FIG. 2, the FDTI 61 and the RDTI 62 face, in the present embodiment, the same side surface of the photodiode 65, and are arranged next to each other in a direction (i.e., a longitudinal direction) parallel to the optical axis of the lens 67. Moreover, the FDTI 61 and the RDTI 62 directly contact each other, but both may be offset (i.e., apart) from each other. In a case where the FDTI 61 and the RDTI 62 are offset from each other, a P-type impurity is inserted into such an offset portion.

Moreover, in the present embodiment, four side surfaces on the back surface side (a side of the photodiode 65 close to the lens 67) are separated by the RDTI 62 as illustrated in B of FIG. 2. On the other hand, three of the four side surfaces are, on the front surface side (a side opposite to the lens 67), separated by the FDTI 61 as illustrated in C of FIG. 2. That is, adjacent 2×2 photodiodes 65 form a single block, and surrounding side surfaces thereof are separated by the FDTI 61.

A floating diffusion (FD) 71 is disposed at the center of each block, and a transfer gate (TG) 72 is disposed close to the FD 71 at each photodiode 65. Moreover, a pixel transistor 73 is disposed on the lower side of each block as viewed in C of FIG. 2. The pixel transistor 73 and the photodiodes 65 are separated by the FDTI 61.

Of the 2×2 photodiodes 65 in each block, adjacent photodiodes 65 in an upper-to-lower direction in C of FIG. 2 are separated by a P-type impurity layer 81 such as boron. Moreover, of the 2×2 photodiodes 65 in each block, part of adjacent photodiodes 65 in a right-to-left direction in C of FIG. 2 is separated by the FDTI 61, and the remaining part of such photodiodes 65 is separated by the impurity layer 81.

(3) Method for Manufacturing Solid-State Imaging Element

Figure 3:
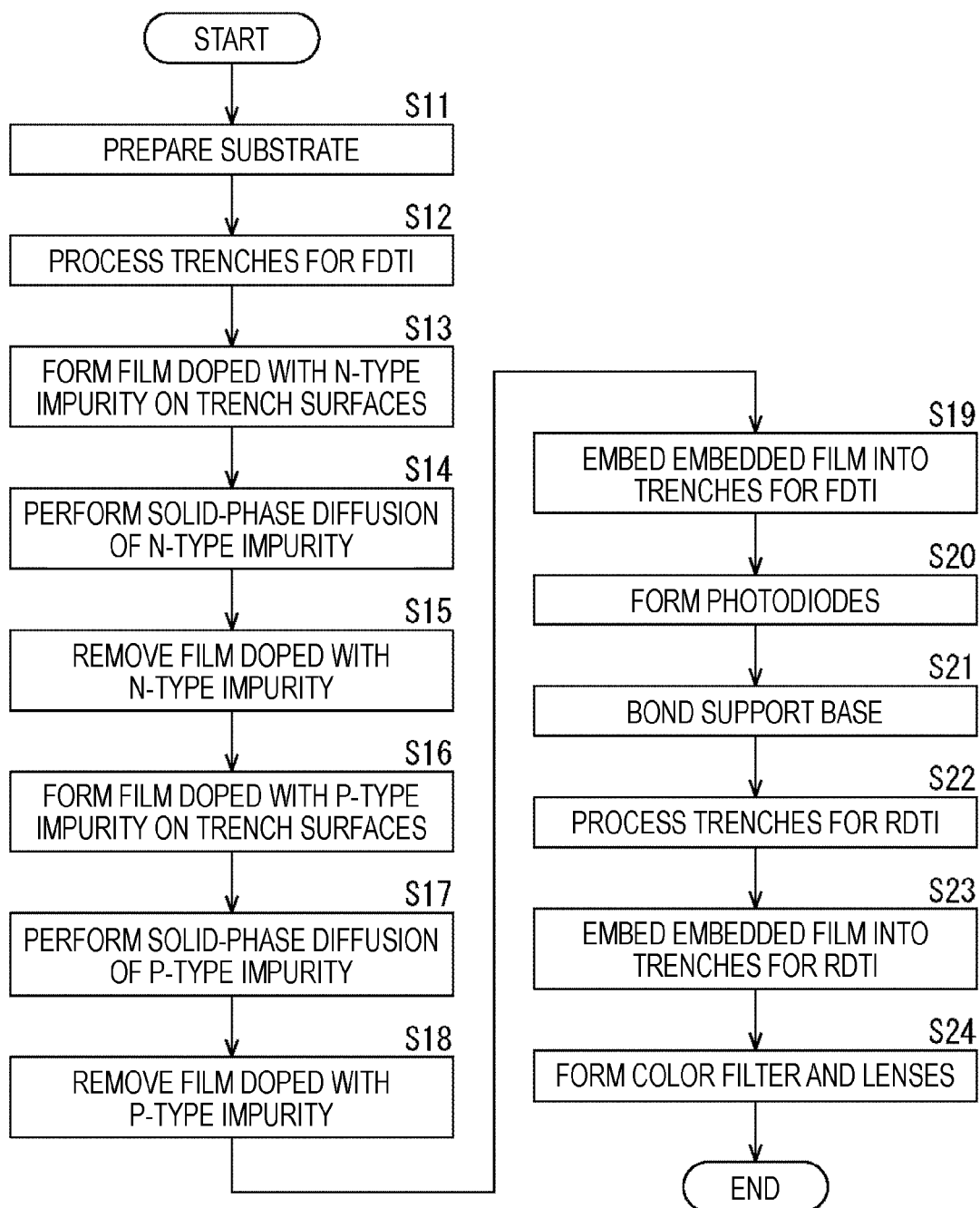
FIG. 3 is a flowchart for describing the method for manufacturing the solid-state imaging element of the first embodiment of the present technology.

Next, the method for manufacturing the solid-state imaging element 51 will be described with reference to FIG. 3 to FIG. 7. FIG. 3 is a flowchart for describing the method for manufacturing the solid-state imaging element of the first embodiment of the present technology, and FIG. 4 to FIG. 7 are views for describing the method for manufacturing the solid-state imaging element of the first embodiment of the present technology.

Figure 4:
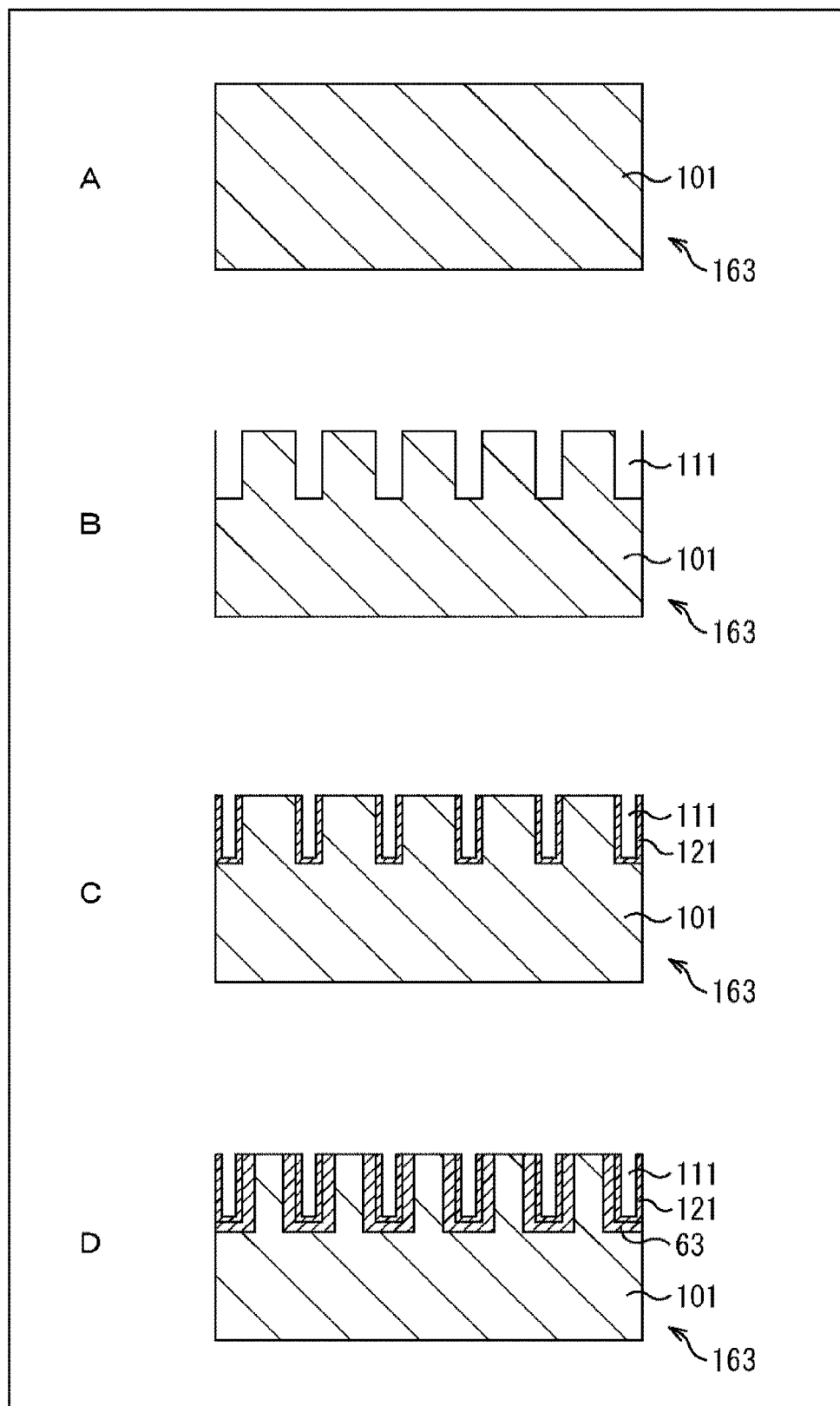
FIG. 4 is a view for describing the method for manufacturing the solid-state imaging element of the first embodiment of the present technology.
Figure 5:
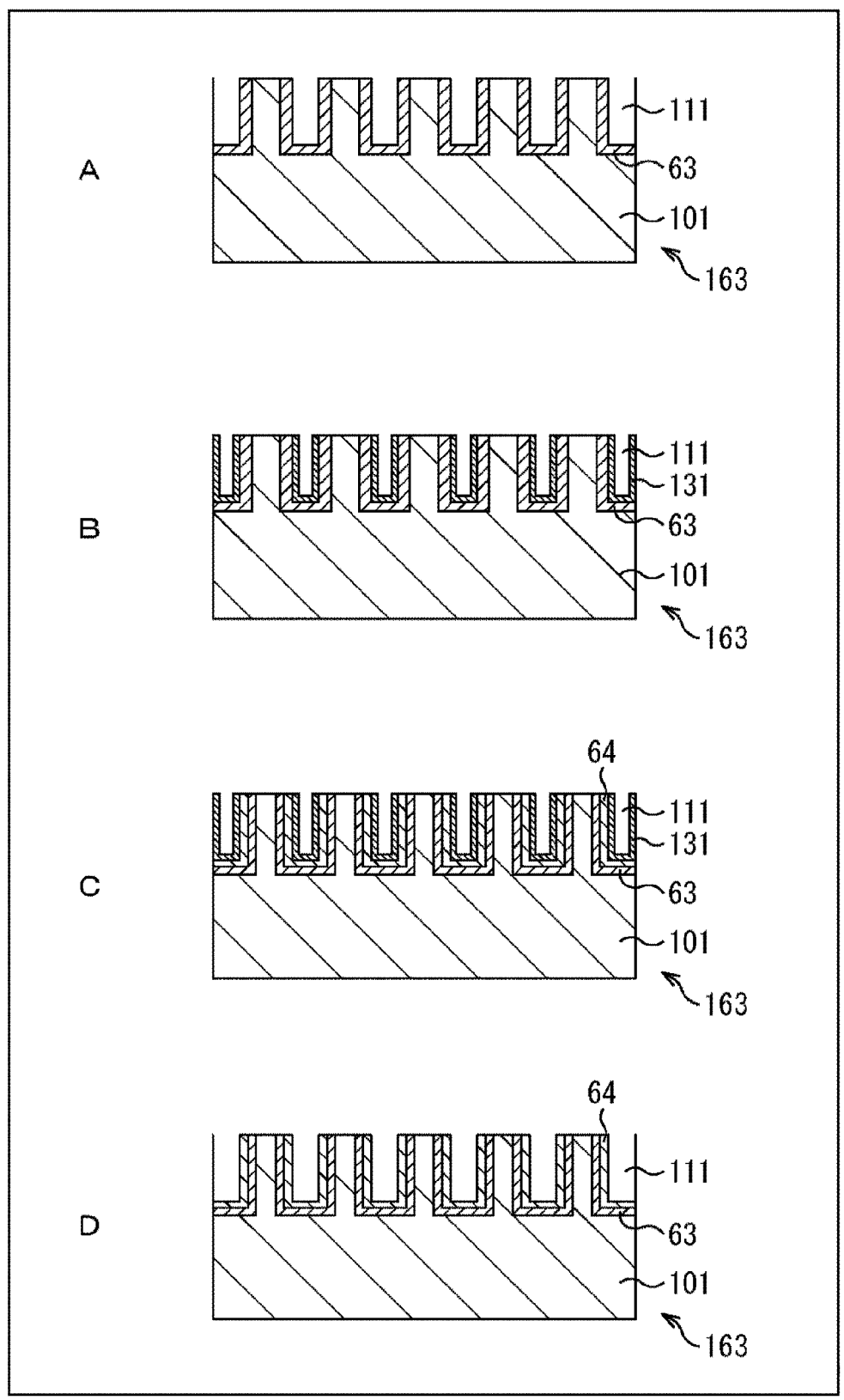
FIG. 5 is a view for describing the method for manufacturing the solid-state imaging element of the first embodiment of the present technology.
Figure 6:
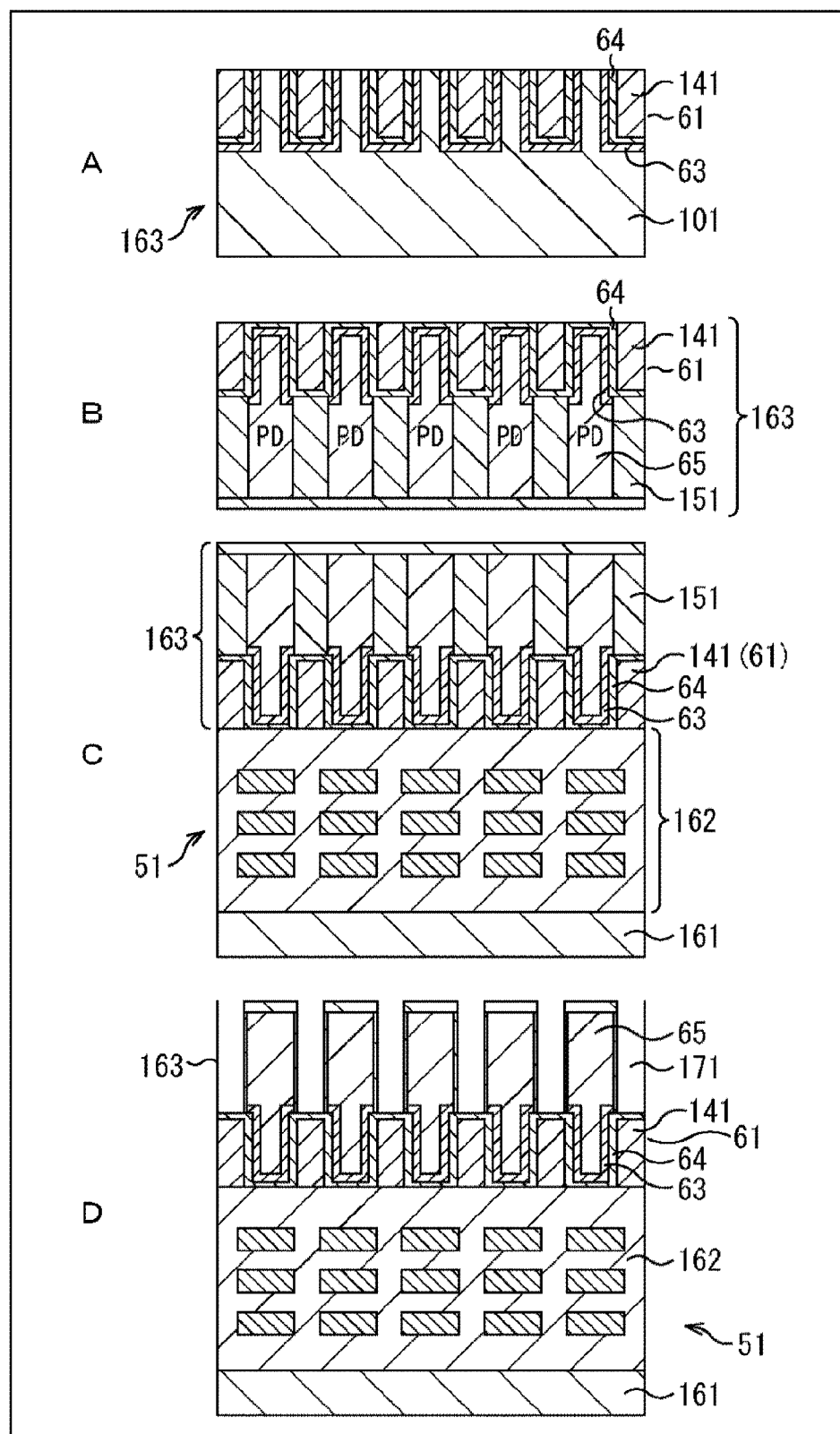
FIG. 6 is a view for describing the method for manufacturing the solid-state imaging element of the first embodiment of the present technology.

First, the processing of preparing a substrate is executed at a step S11. A of FIG. 4 illustrates the prepared silicon (Si) substrate 101, for example. At a step S12, trench processing for a FDTI 61 is executed. That is, as illustrated in B of FIG. 4, trenches 111 are, by lithography and etching, formed at the substrate 101 prepared at the step S11. In B of FIG. 4, a front surface side (i.e., a side on which a wiring layer 162 is to be disposed) of a semiconductor layer 163 is in an upward direction. That is, the trenches 111 are formed from the front surface side (i.e., a first surface side on which the wiring layer 162 is to be disposed) of the semiconductor layer 163 (these trenches are for forming the FDTI 61 of B of FIG. 7 described later).

At a step S13, the processing of forming, on a surface of each trench 111, a film doped with an N-type impurity is executed. For example, as illustrated in C of FIG. 4, a film 121 doped with phosphorus (P) is formed in each trench 111 by, e.g., chemical vapor deposition (CVD).

At a step S14, the processing of performing solid-phase diffusion of the N-type impurity is executed. That is, solid-phase diffusion is performed in such a manner that the phosphorus film 121 formed by the processing of the step S13 is thermally processed. Because it is still before formation of photodiodes 65, there is a low probability that the heat treatment poses an obstacle. Thus, as illustrated in D of FIG. 4, an N-type impurity layer 63 is formed in the substrate 101 at the periphery of each trench 111.

At a step S15, the processing of removing the film 121 doped with the N-type impurity is executed. That is, the film 121 formed in each trench 111 at the step S13 is removed. This brings a state in which the N-type impurity layer 63 is formed in the substrate 101 at the periphery of each trench 111 as illustrated in A of FIG. 5.

At a step S16, the processing of forming, on the surface of each trench 111, a film doped with a P-type impurity is executed. For example, as illustrated in B of FIG. 5, a film 131 of a P-type impurity such as boron (B) is formed in each trench 111 by, e.g., CVD.

At a step S17, the processing of performing solid-phase diffusion of the P-type impurity is executed. That is, solid-phase diffusion of the P-type impurity is performed in such a manner that heat treatment is performed for the P-type impurity film 131 formed at the step S16. Because it is still before formation of the photodiodes 65, there is a low probability that the heat treatment poses an obstacle. Thus, as illustrated in C of FIG. 5, a P-type impurity layer 64 is formed in the substrate 101 (i.e., in a region where the impurity layer 63 is formed) at the periphery of each trench 111, for example.

At a step S18, the processing of removing the film 131 doped with the P-type impurity is executed. That is, as illustrated in D of FIG. 5, the film 131 formed for solid-phase diffusion in each trench 111 at the step S16 is removed, leading to a state in which the N-type impurity layer 63 and the P-type impurity layer 64 are formed in the substrate 101 at the periphery of each trench 111.

The N-type impurity layer 63 and the P-type impurity layer 64 having a concentration level similar to 1SR are formed, and therefore, an intense electric field portion is produced at a side wall of the FDTI 61. Consequently, both of separation between pixels and improvement of a saturated charge amount Qs can be realized.

At a step S19, the processing of embedding an insulator in each trench 111 for the FDTI is executed. For example, as illustrated in A of FIG. 6, an embedded film 141 made of an insulator such as $SiO_2$ is embedded in each trench 111. In this manner, the FDTI 61 is formed.

At a step S20, the processing of forming the photodiodes 65 is executed. That is, as illustrated in B of FIG. 6, the photodiodes 65 are formed by ion implantation of an N-type impurity. In this manner, the semiconductor layer 163 is formed. Further, a gate, peripheral transistors, and a wiring layer are formed.

Moreover, for pinning of a RDTI 62, a P-type impurity is implanted into a region 151 between adjacent ones of the photodiodes 65. Note that such processing can be omitted in a case where a fixed charge film is used for a surface of the RDTI 62. The fixed charge film will be described later.

At a step S21, the processing of bonding a support base is executed. Thus, a configuration is realized, in which the wiring layer 162 is disposed on the support base 161 and the semiconductor layer 163 is further disposed on the wiring layer 162 as illustrated in C of FIG. 6. In the wiring layer 162, a line for transmitting/receiving a signal to/from the photodiode 65 is disposed. Then, a light reception side (i.e., an upper surface of the semiconductor layer 163 of C of FIG. 6) is polished.

At a step S22, trench processing for the RDTI 62 is executed. That is, as illustrated in D of FIG. 6, a trench 171 for the RDTI 62 is formed in the region 151 between adjacent ones of the photodiodes 65. In D of FIG. 6, a back surface side (i.e., a second surface side on which an optical layer 164 is to be disposed) of the semiconductor layer 163 is in an upward direction. That is, the trenches 171 are formed from the back surface side (i.e., the side on which the optical layer 164 is to be disposed) of the semiconductor layer 163 (these trenches are for forming the RDTI 62 of B of FIG. 7 described later).

At a step S23, the processing of embedding an embedded film in each trench 171 for the RDTI 62 is executed. That is, as illustrated in A of FIG. 7, an embedded film 181 made of an insulator such as $SiO_2$ is embedded into the region 151 between adjacent ones of the photodiodes 65. In this manner, the RDTI 62 is formed on the FDTI 61 (on the light reception side).

At a step S24, the processing of forming a color filter 66 and lenses 67 is executed. That is, as illustrated in B of FIG. 7, the optical layer 164 including the color filter 66 and the lenses 67 is formed on the semiconductor layer 163. That is, the lenses 67 are arranged on the back surface side, and the wiring layer 162 is disposed on the front surface side (a side opposite to the lenses 67). In this manner, the solid-state semiconductor element 51 is manufactured.

Figure 8:
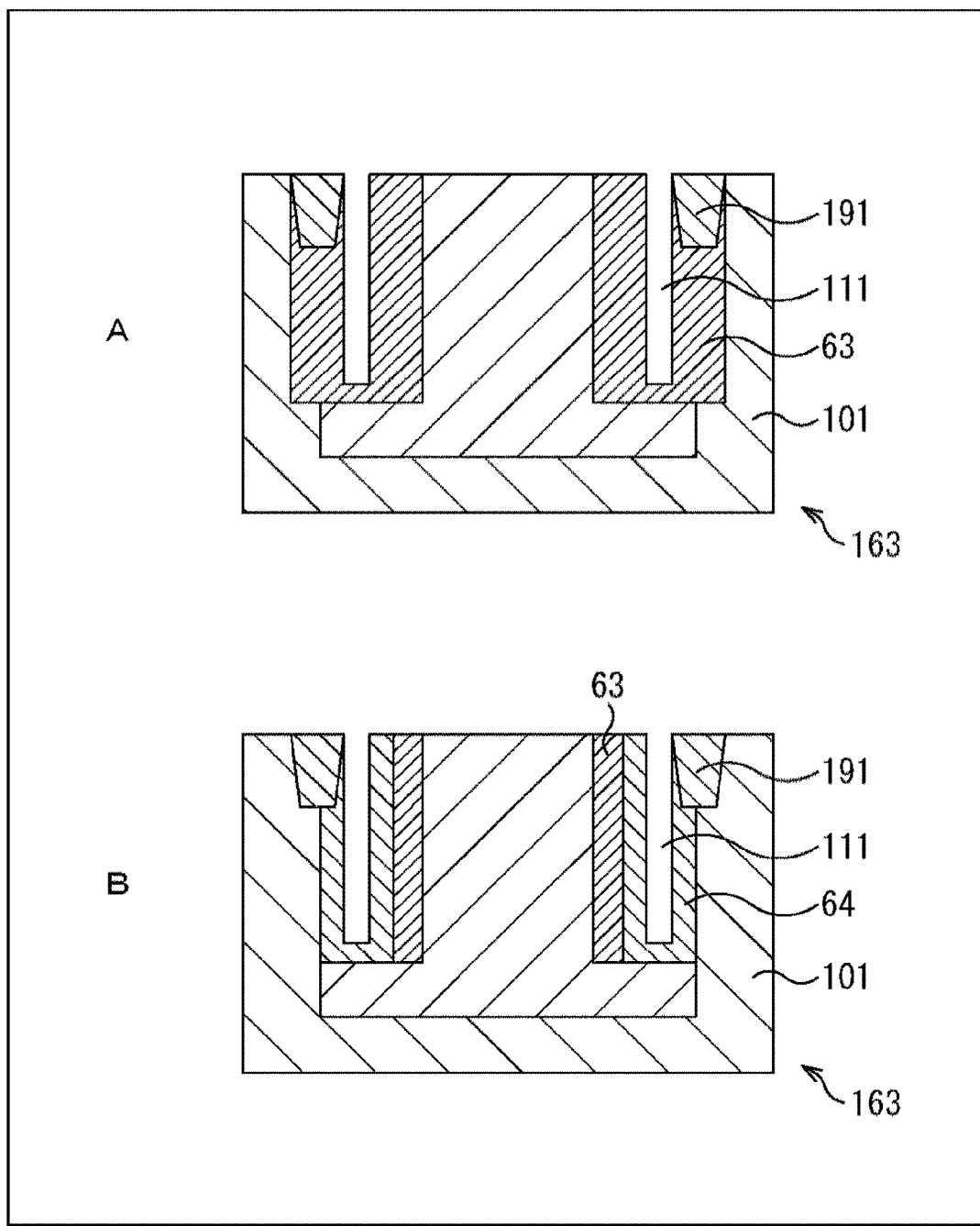
FIG. 8 is a view for describing the method for manufacturing the solid-state imaging element of the first embodiment of the present technology.
Figure 9:
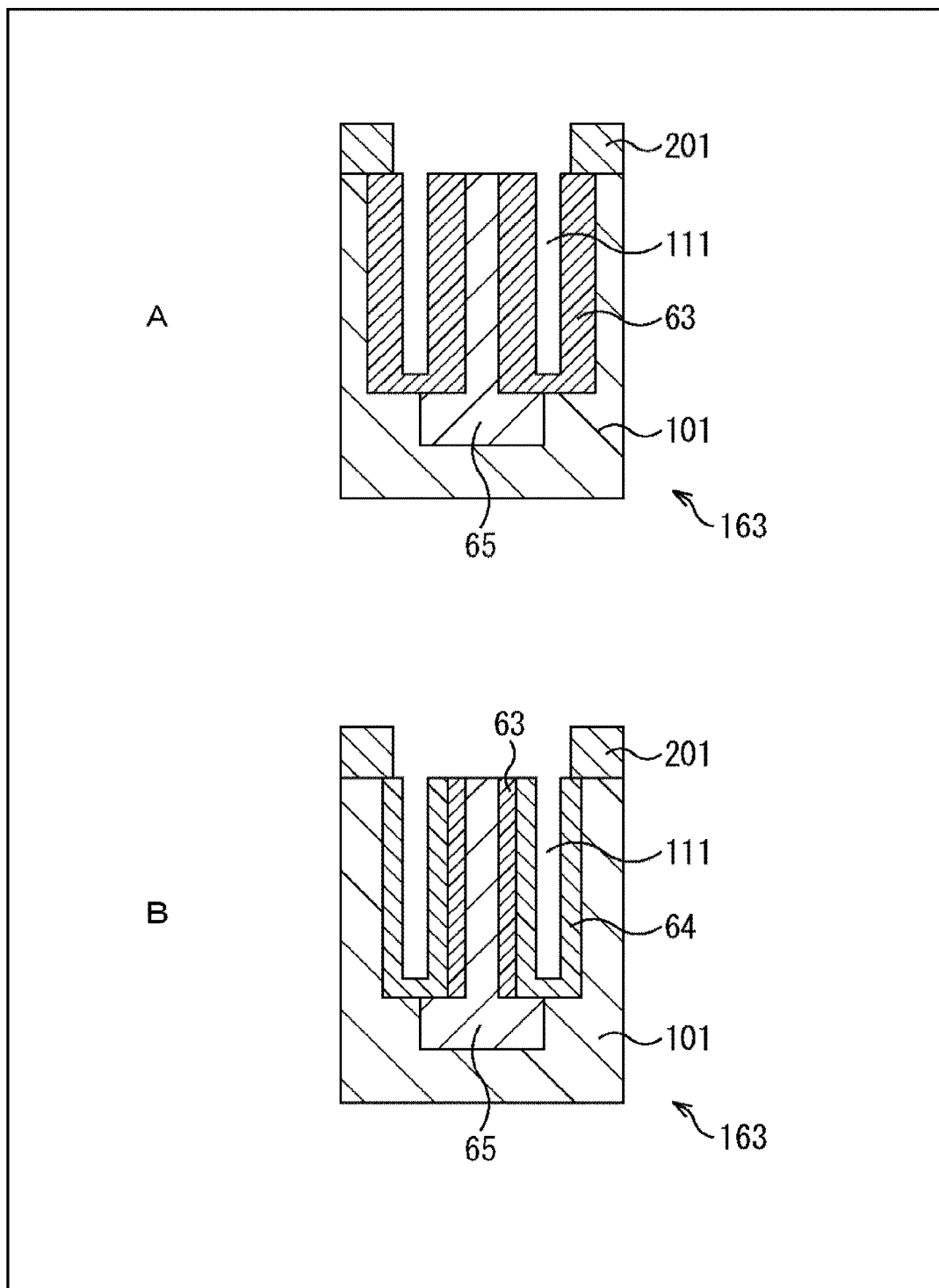
FIG. 9 is a view for describing the method for manufacturing the solid-state imaging element of the first embodiment of the present technology.

Note that manufacturing methods as illustrated in FIG. 8 and FIG. 9 can be employed. FIG. 8 is a view for describing the method for manufacturing the solid-state imaging element of the first embodiment of the present technology. The depth of the FDTI 61 is 0.5 to 2 μm which is deeper than a shallow trench isolation (STI) with around 0.3 μm. In addition to the FDTI 61 and the RDTI 62, the STI can be combined. In this case, the trenches 111 are formed after a STI 191 has been formed in advance, and then, solid-phase diffusion of the N-type impurity layer 63 is further performed, as illustrated in A of FIG. 8. Then, as illustrated in B of FIG. 8, solid-phase diffusion of the P-type impurity layer 64 is further performed. Thereafter, the processing of implanting the photodiodes 65 and formation of the peripheral transistors are further executed.

FIG. 9 is a view for describing the method for manufacturing the solid-state imaging element of the first embodiment of the present technology. In this example, lightly doped drains (LDDs), sidewalls, sources, drains, etc. of a pixel transistor and a logic transistor are formed after the processing of implanting the photodiodes 65 and the processing of forming a gate 201 have been performed. Then, as illustrated in A of FIG. 9, the trenches 111 are formed, and the N-type impurity layer 63 is formed by solid-phase diffusion. Further, as illustrated in B of FIG. 9, the P-type impurity layer 64 is formed by solid-phase diffusion.

Figure 10:
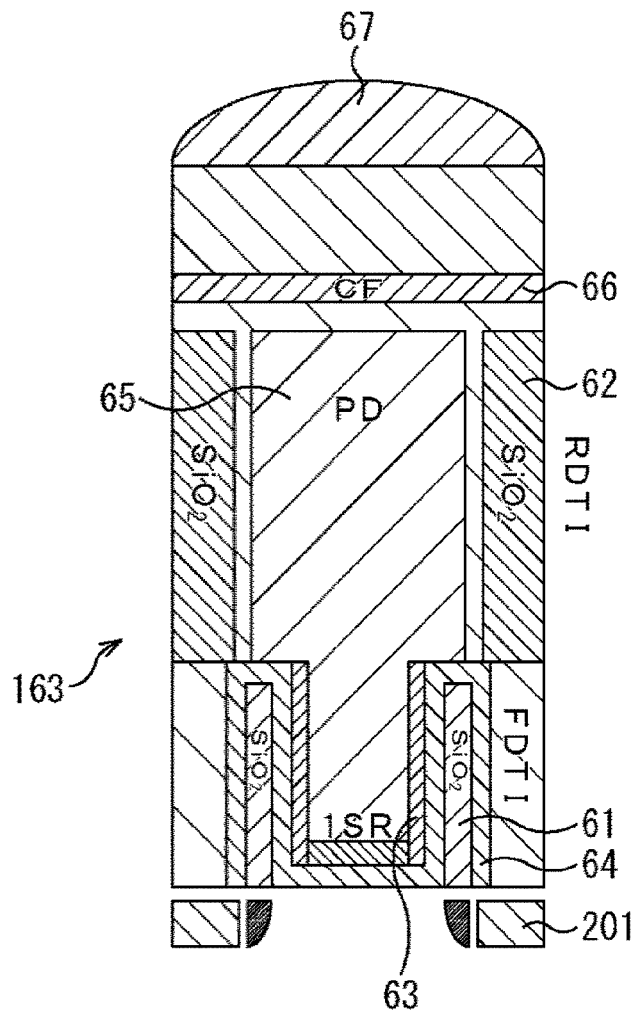
FIG. 10 is a view of the configuration of the solid-state imaging element of the first embodiment of the present technology.

Moreover, in the above-described example, the FDTI 61 and the RDTI 62 are formed to directly contact each other, but can be offset from each other in the longitudinal direction or a transverse direction. FIG. 10 illustrates an example of this case. FIG. 10 is a view of the configuration of the solid-state imaging element of the first embodiment of the present technology. In the example of FIG. 10, the FDTI 61 is slightly offset (i.e., shifted) inward from the RDTI 62.

Figure 11:
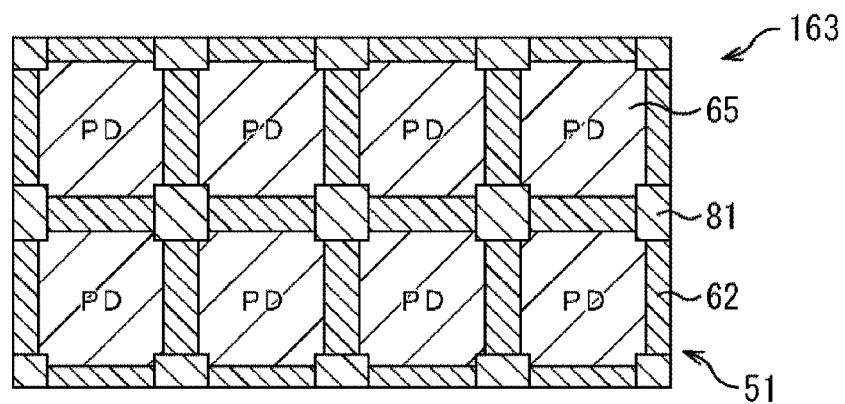
FIG. 11 is a view of the configuration of the solid-state imaging element of the first embodiment of the present technology.

The solid-state imaging element 51 illustrated in FIG. 2 can have a back surface configuration as illustrated in FIG. 11 instead of the configuration illustrated in B of FIG. 2. FIG. 11 is a view of the configuration of the solid-state imaging element of the first embodiment of the present technology. As clearly seen from comparison between FIG. 11 and B of FIG. 2, a configuration example of FIG. 11 is made such that intersection portions of the RDTI 62 contacting four side surfaces of each photodiode 65 are separated by the P-type impurity layer 81. Other configurations are similar to those in the case illustrated in B of FIG. 2.

(4) Configuration 1 of Another Combination of FDTI and RDTI

Figure 12:
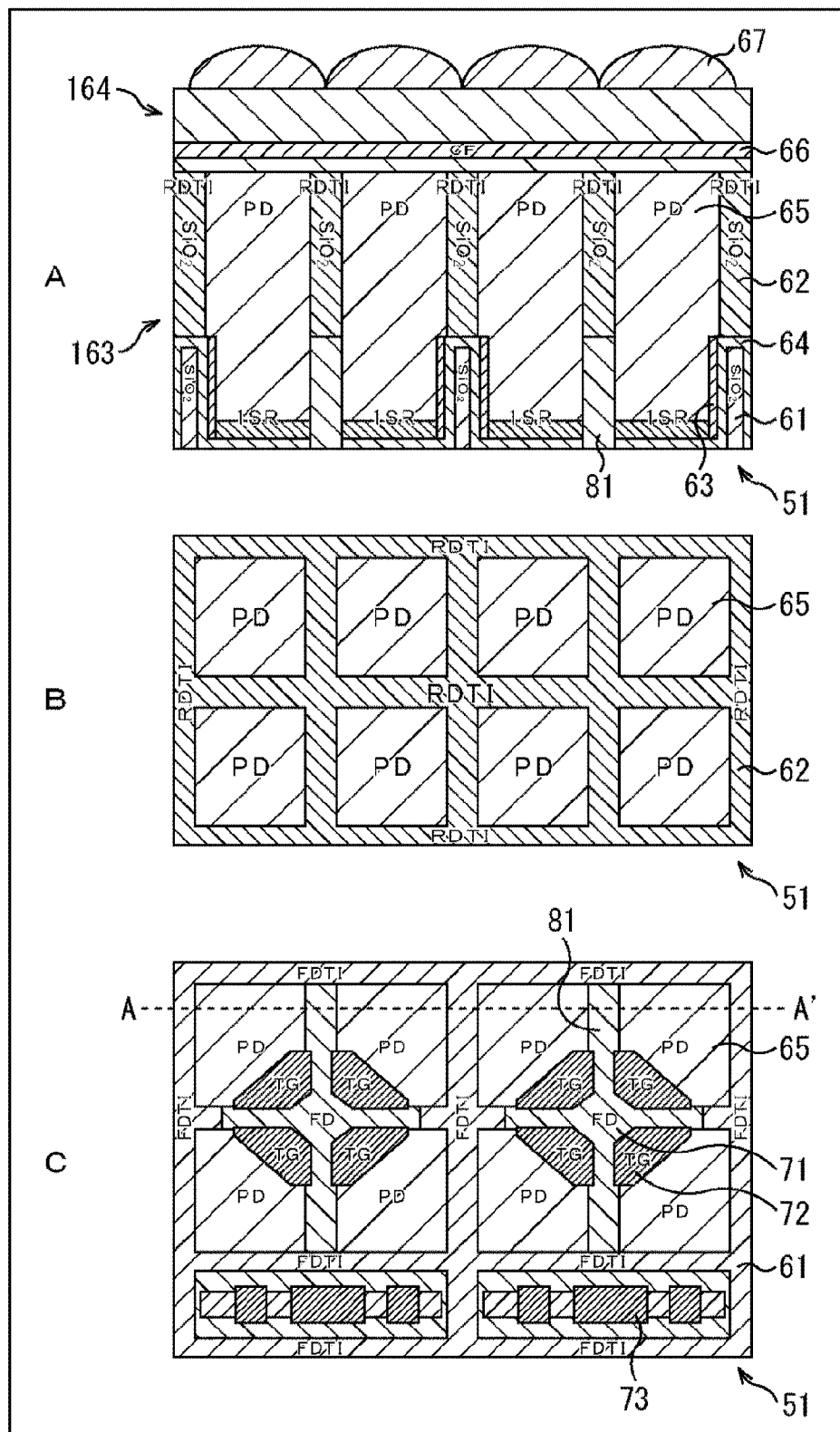
FIG. 12 is a view of the configuration of the solid-state imaging element of the first embodiment of the present technology.

A configuration of another combination of the FDTI 61 and the RDTI 62 will be described below. FIG. 12 is a view of the configuration of the solid-state imaging element of the first embodiment of the present technology. B and C of FIG. 12 respectively illustrate the configurations of the back and front surfaces of the solid-state imaging element 51, and A of FIG. 12 illustrates a configuration of a cross section of the solid-state imaging element 51 along an A-A' line of C of FIG. 12.

In a configuration example of FIG. 12, four side surfaces of each photodiode 65 on a back surface side are separated by a RDTI 62 as illustrated in B of FIG. 12. On a front surface side, 2×2 photodiodes 65 on the front surface side (the lower side as viewed in A of FIG. 12) form, on the other hand, a single block, and the periphery thereof is separated by a FDTI 61 as illustrated in C of FIG. 12.

Of the 2×2 photodiodes 65 of each block, adjacent photodiodes 65 in a right-to-left direction in C of FIG. 12 are separated by a P-type impurity layer 81. Moreover, of the 2×2 photodiodes 65 of each block, right and left end portions of adjacent photodiodes 65 in an upper-to-lower direction in C of FIG. 12 are separated by the FDTI 61, and the remaining center portions of these photodiodes 65 are separated by the impurity layer 81. Of four side surfaces on the front surface side, three side surfaces are separated by the FDTI 61.

Thus, as illustrated in A of FIG. 12, the configuration of the cross section along the A-A' line of C of FIG. 12 is, on the front surface side (the lower side as viewed in A of FIG. 12), made such that the FDTI 61 and the impurity layer 81 alternately separate the photodiodes 65 arranged in the right-to-left direction. On the back surface side (the upper side as viewed in A of FIG. 12), the photodiodes 65 are separated by the RDTI 62. That is, one side surface of each photodiode 65 is separated by the FDTI 61 and the RDTI 62, and another side surface of such a photodiode 65 is separated by the RDTI 62 and the impurity layer 81. Other configurations are similar to those in the case of FIG. 2.

Figure 13:
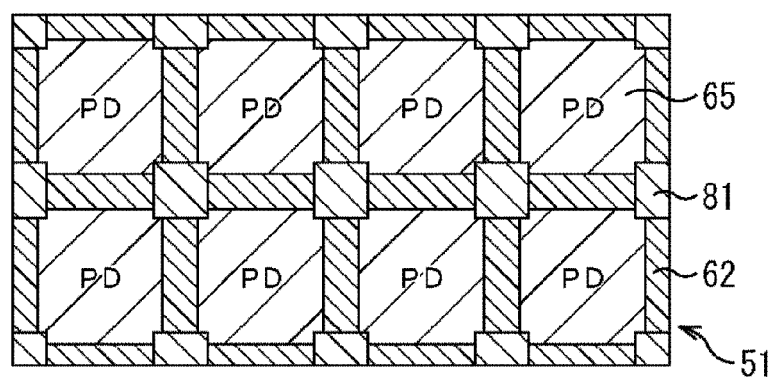
FIG. 13 is a view of the configuration of the solid-state imaging element of the first embodiment of the present technology.

FIG. 13 is a view of the configuration of the solid-state imaging element of the first embodiment of the present technology. The solid-state imaging element 51 illustrated in FIG. 12 can have a back surface configuration as illustrated in FIG. 13 instead of the configuration illustrated in B of FIG. 12. As clearly seen from comparison between FIG. 13 and B of FIG. 12, a configuration example of FIG. 13 is made such that intersection portions of the RDTI 62 contacting four side surfaces of each photodiode 65 are separated by the P-type impurity layer 81. Other configurations are similar to those in the case illustrated in B of FIG. 12.

(5) Configuration 2 of Still Another Combination of FDTI and RDTI

Figure 14:
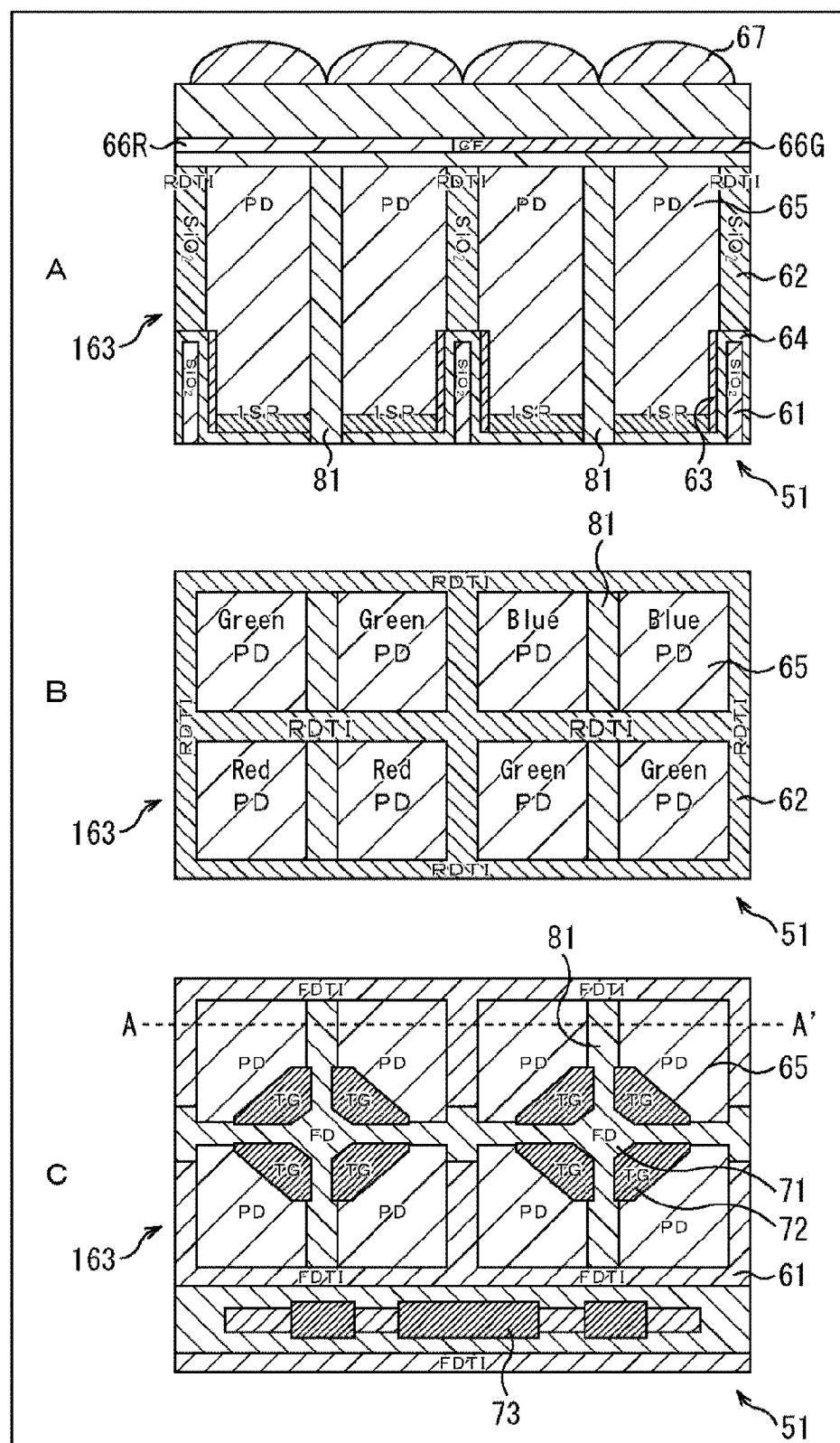
FIG. 14 is a view of the configuration of the solid-state imaging element of the first embodiment of the present technology.

FIG. 14 is a view of the configuration of the solid-state imaging element of the first embodiment of the present technology. B and C of FIG. 14 respectively illustrate the configurations of the back and front surfaces of the solid-state imaging element 51, and A of FIG. 14 illustrates a configuration of across section of the solid-state imaging element 51 along an A-A' line of C of FIG. 14.

FIG. 14 illustrates a dual pixel configuration example. In this configuration example, photodiodes 65 in the same color selected from each color of red (R), green (G), and blue (B) are, two by two, arranged next to each other as illustrated in B of FIG. 12. In the example of B of FIG. 14, two upper left photodiodes 65 and two lower right photodiodes 65 are in the color of G, two upper right photodiodes 65 are in the color of B, and two lower left photodiodes 65 are in the color of R.

Moreover, on a back surface side, two photodiodes 65 in the same color form a block, and adjacent blocks are separated by a RDTI 62 as illustrated in B of FIG. 14. Further, two adjacent photodiodes 65 in the same color in the block are separated by a P-type impurity layer 81 such as boron. For example, two upper right photo diodes 65 in the block of B are separated by the impurity layer 81. The same applies to the blocks of G and R.

On the other hand, the block of 2×2 photodiodes 65 is, on a front surface side, basically separated by a FDTI 61 as illustrated in C of FIG. 14. Moreover, a substantially center portion of the FDTI 61 extending in the longitudinal direction as viewed in the figure is replaced with the impurity layer 81. Further, the 2×2 photodiodes 65 in the block are separated by the impurity layer 81.

As illustrated in A of FIG. 14 illustrating the configuration of the cross section along the A-A' line of C of FIG. 14, the photodiodes 65 in the same color are separated by the impurity layer 81. For example, separation by the impurity layer 81 is made at a boundary between photodiodes 65 positioned at the center of a color filter 66R in the color of R in a right-to-left direction and a boundary between photodiodes 65 positioned at the center of a color filter 66G in the color of G in the right-to-left direction. At a boundary between adjacent colors, separation is made by the RDTI 62 on the back surface side (the upper side as viewed in the figure), and separation is made by the FDTI 61 on the front surface side (the lower side as viewed in the figure).

In the example of FIG. 14, it is configured such that pixels in the same color are not separated by the RDTI 62, but it can be configured such that these pixels are separated by the RDTI 62. Moreover, the FDTI 61 is not formed between the pixels in the same color in a case where an OFS with a charge tunneling structure is used between the pixels in the same color on the front surface side, and can be formed in the case of using the OFS.

Figure 15:
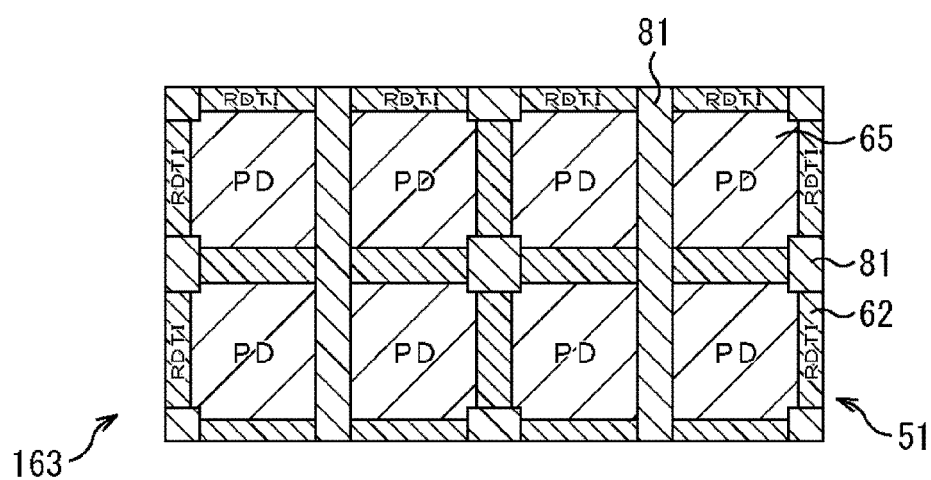
FIG. 15 is a view of the configuration of the solid-state imaging element of the first embodiment of the present technology.

FIG. 15 is a view of the configuration of the solid-state imaging element of the first embodiment of the present technology. The solid-state imaging element 51 illustrated in FIG. 14 can have a back surface configuration as illustrated in FIG. 15 instead of the configuration illustrated in B of FIG. 14. As clearly seen from comparison between FIG. 15 and B of FIG. 14, a configuration example of FIG. 15 is made such that an intersection portion between adjacent portions of the RDTI 62 and an intersection portion between the RDTI 62 and the impurity layer 81 are separated by the P-type impurity layer 81. Other configurations are similar to those in the case illustrated in B of FIG. 14.

(6) Configuration 3 of Still Another Combination of FDTI and RDTI

Figure 16:
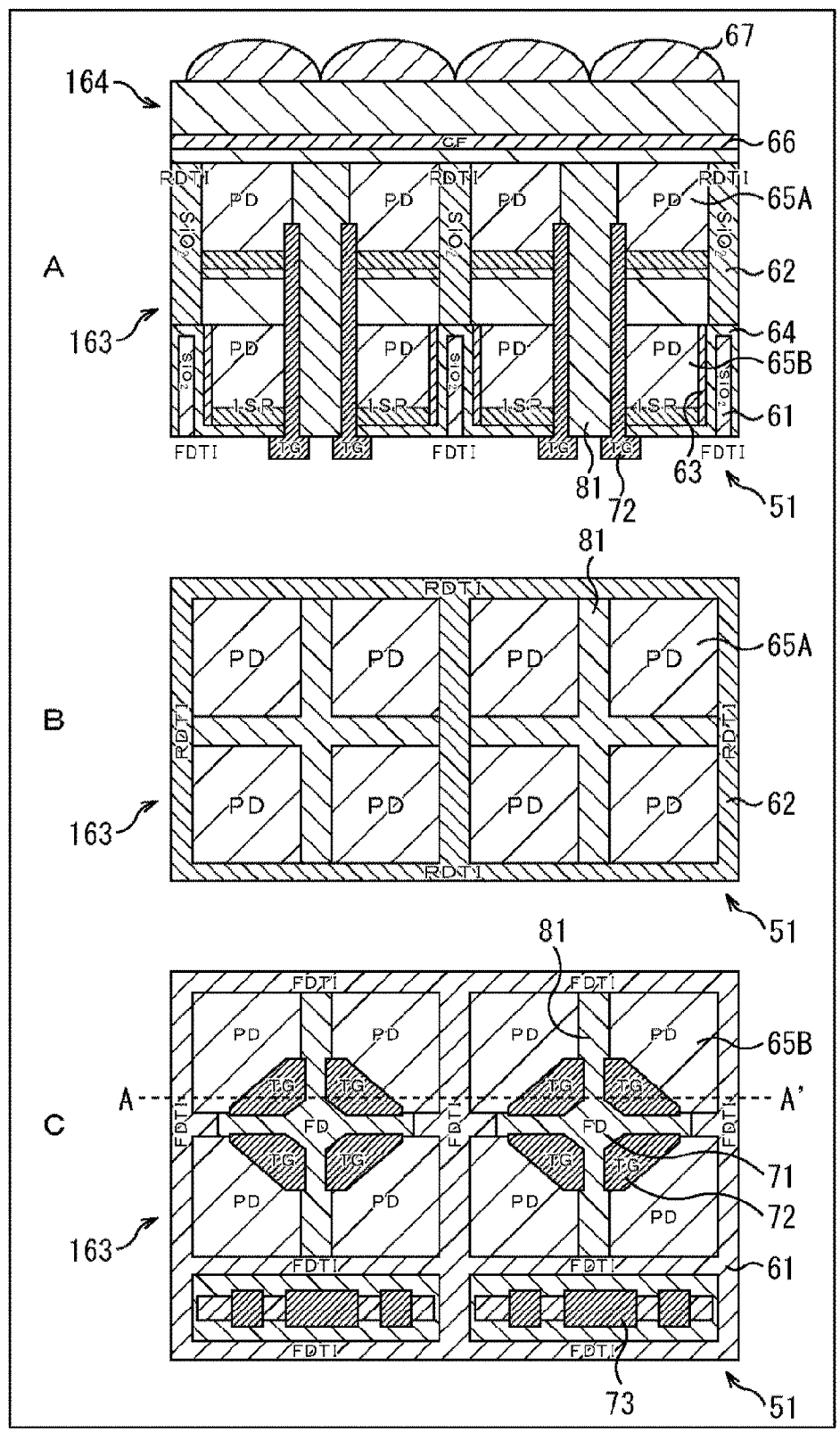
FIG. 16 is a view of the configuration of the solid-state imaging element of the first embodiment of the present technology.

FIG. 16 is a view of the configuration of the solid-state imaging element of the first embodiment of the present technology. B and C of FIG. 16 respectively illustrate the configurations of the back and front surfaces of the solid-state imaging element 51, and A of FIG. 16 illustrates a configuration of across section of the solid-state imaging element 51 along an A-A' line of C of FIG. 16.

FIG. 16 illustrates an example in a case where photodiodes 65 are configured in two tiers. As illustrated in B of FIG. 16, 2×2 photodiodes 65 on a back surface side form a block, and each block is separated by a RDTI 62. The 2×2 photodiodes 65 in each block are separated by an impurity layer 81.

A front surface side is similarly configured as in the example of C of FIG. 12. That is, as illustrated in C of FIG. 16, 2×2 photodiodes 65 on the front surface side form a single block, and the periphery thereof is separated by a FDTI 61.

Of the 2×2 photodiodes 65 in each block, adjacent photodiodes 65 in a right-to-left direction in C of FIG. 16 are separated by the P-type impurity layer 81. Moreover, of the 2×2 photodiodes 65 in each block, right and left end portions of adjacent photodiodes 65 in an upper-to-lower direction in C of FIG. 16 are separated by the FDTI 61, and the remaining center portions of these photodiodes 65 are separated by the impurity layer 81.

Thus, as illustrated in A of FIG. 16, the configuration of the cross section along the A-A' line of C of FIG. 16 is, on the front surface side (the lower side as viewed in the figure), made such that the FDTI 61 and the impurity layer 81 alternately separate lower photodiodes 65 arranged in the right-to-left direction. On the back surface side (the upper side as viewed in the figure), the RDTI 62 and the impurity layer 81 alternately separate upper photodiodes 65 arranged in the right-to-left direction.

For charge transfer of the photodiodes 65 in two tiers, a vertical transistor structure can be used, or a transfer plug can be formed of an impurity by ion implantation.

Figure 17:
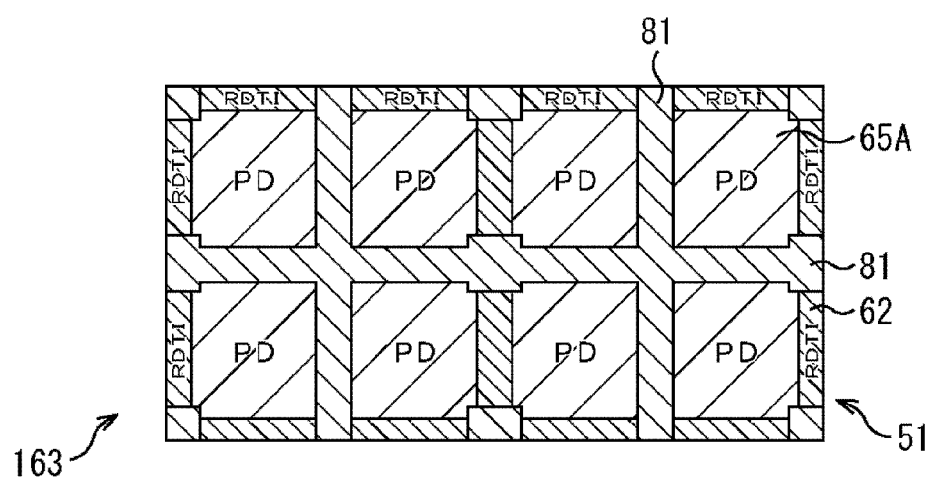
FIG. 17 is a view of the configuration of the solid-state imaging element of the first embodiment of the present technology.

FIG. 17 is a view of the configuration of the solid-state imaging element of the first embodiment of the present technology. The solid-state imaging element 51 illustrated in FIG. 16 can have a back surface configuration as illustrated in FIG. 17 instead of the configuration illustrated in B of FIG. 16. As clearly seen from comparison between FIG. 17 and B of FIG. 16, a configuration example of FIG. 17 is made such that an intersection portion between adjacent portions of the RDTI 62 and an intersection portion between the RDTI 62 and the impurity layer 81 are separated by the P-type impurity layer 81. Other configurations are similar to those in the case illustrated in B of FIG. 16.

(7) Configuration 4 of Still Another Combination of FDTI and RDTI

Figure 18:
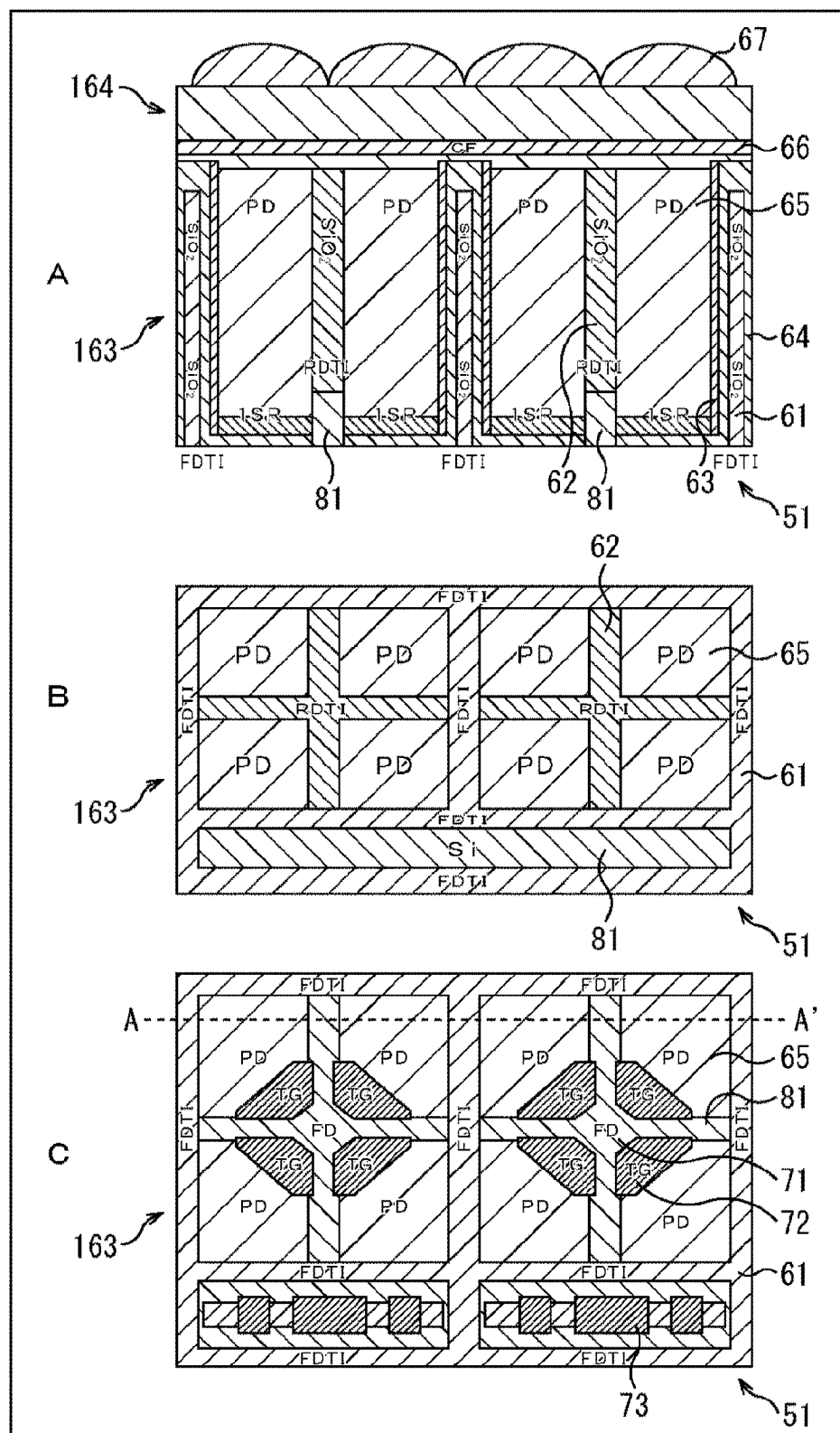
FIG. 18 is a view of the configuration of the solid-state imaging element of the first embodiment of the present technology.

FIG. 18 is a view of the configuration of the solid-state imaging element of the first embodiment of the present technology. B and C of FIG. 18 respectively illustrate the configurations of the back and front surfaces of the solid-state imaging element 51, and A of FIG. 18 illustrates a configuration of across section of the solid-state imaging element 51 along an A-A' line of C of FIG. 18.

On a back surface side, 2×2 photodiodes 65 form a block, and each block is separated by a FDTI 61 as illustrated in B of FIG. 18. The 2×2 photodiodes 65 in each block are separated by a RDTI 62.

On a front surface side, 2×2 photodiodes 65 form a single block, and the periphery thereof is separated by the FDTI 61 as illustrated in C of FIG. 18.

In each block, adjacent photodiodes 65 in a right-to-left direction are separated by a P-type impurity layer 81, and adjacent photodiodes 65 in an upper-to-lower direction are separated by the P-type impurity layer 81.

Thus, as illustrated in A of FIG. 18, the FDTI 61 and the impurity layer 81 alternately separate, in the cross section along the A-A' line of C of FIG. 18, the photodiodes 65 arranged in the right-to-left direction.

Figure 19:
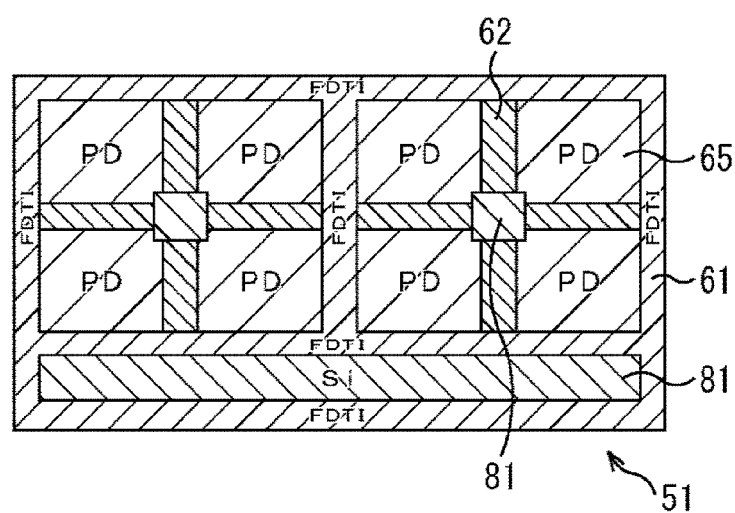
FIG. 19 is a view of the configuration of the solid-state imaging element of the first embodiment of the present technology.

FIG. 19 is a view of the configuration of the solid-state imaging element of the first embodiment of the present technology. The solid-state imaging element 51 illustrated in FIG. 18 can have a back surface configuration as illustrated in FIG. 19 instead of the configuration illustrated in B of FIG. 18. As clearly seen from comparison between FIG. 19 and B of FIG. 18, a configuration example of FIG. 19 is made such that an intersection portion between adjacent portions of the RDTI 62 in each block are separated by the P-type impurity layer 81. Other configurations are similar to those in the case illustrated in B of FIG. 18.

(8) Configuration 5 of Still Another Combination of FDTI and RDTI

Figure 20:
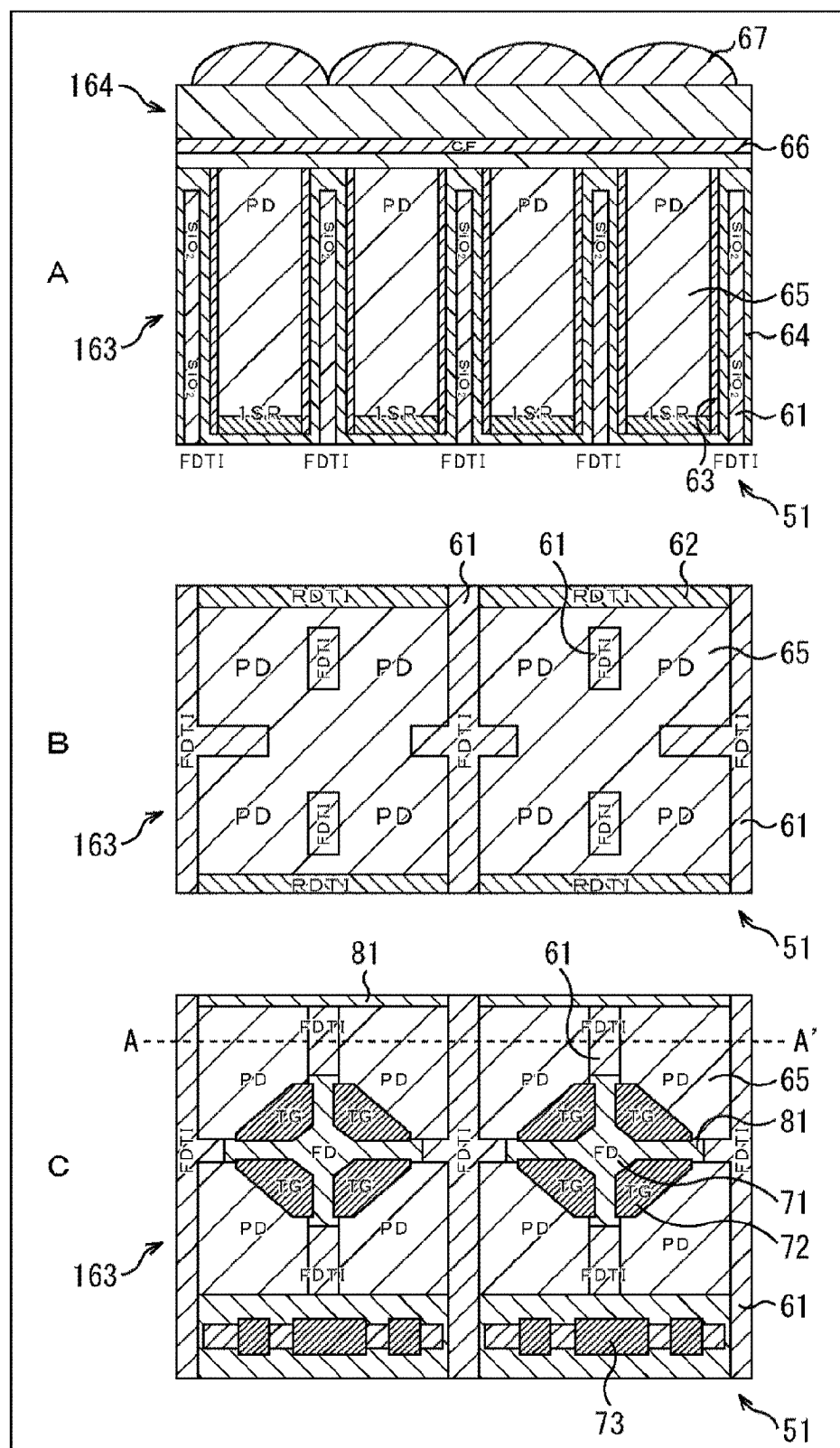
FIG. 20 is a view of the configuration of the solid-state imaging element of the first embodiment of the present technology.

FIG. 20 is a view of the configuration of the solid-state imaging element of the first embodiment of the present technology. B and C of FIG. 20 respectively illustrate the configurations of the back and front surfaces of the solid-state imaging element 51, and A of FIG. 20 illustrates a configuration of across section of the solid-state imaging element 51 along an A-A' line of C of FIG. 20.

In the solid-state imaging element 51 of the embodiment of FIG. 20, 2×2 photodiodes 65 on a back surface side form a single block, and the block is separated by a FDTI 61 at right and left boundaries and by a RDTI 62 at upper and lower boundaries as illustrated in B of FIG. 20.

In the block, the vicinity of right and left end portions at a boundary between upper and lower sides for separating the photodiodes 65 to the upper and lower sides are separated by the FDTI 61, and the vicinity of the center of the block at a boundary between right and left sides for separating the photodiodes 65 to the right and left sides is separated by the FDTI 61. Eventually, three side surfaces of the photodiode 65 are separated by the FDTI 61, and the remaining one side surface of the photodiode 65 is separated by the RDTI 62.

On a front surface side, 2×2 photodiodes 65 forms a single block, and the block is separated by the FDTI 61 at right and left boundaries and by an impurity layer 81 at upper and lower boundaries as illustrated in C of FIG. 20.

In the block, the vicinity of upper and lower end portions at a boundary between the right and left sides of C of FIG. 20 is separated by the FDTI 61, and the vicinity of right and left end portions at a boundary between the upper and lower sides of C of FIG. 20 is also separated by the FDTI 61. In the vicinity of the center of the block, separation by the impurity layer 81 is made at both of the boundary between the upper and lower sides and the boundary between the right and left sides.

As illustrated in A of FIG. 20, the photodiodes 65 are separated by the FDTI 61 in the cross section along the A-A' line of C of FIG. 20.

Figure 21:
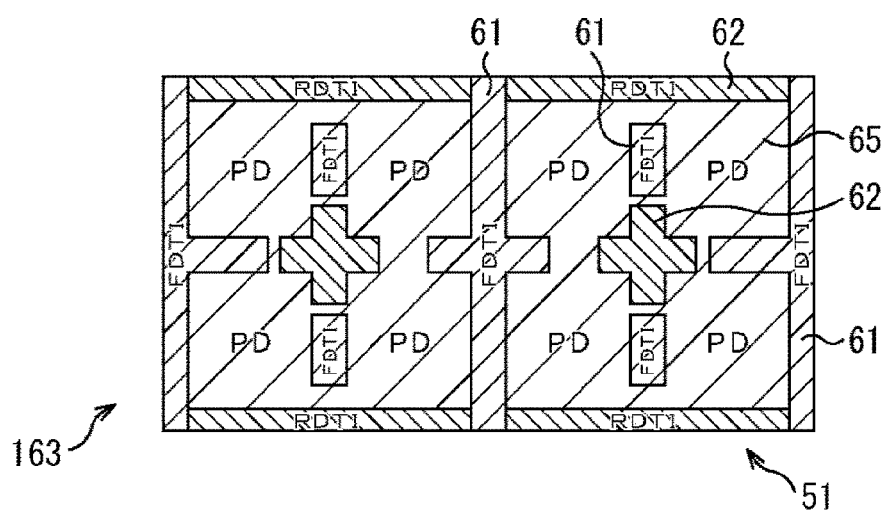
FIG. 21 is a view of the configuration of the solid-state imaging element of the first embodiment of the present technology.

FIG. 21 is a view of the configuration of the solid-state imaging element of the first embodiment of the present technology. The solid-state imaging element 51 illustrated in FIG. 20 can have a back surface configuration as illustrated in FIG. 21 instead of the configuration illustrated in B of FIG. 20. As clearly seen from comparison between FIG. 21 and B of FIG. 20, a configuration example of FIG. 21 is made such that center portions of the 2×2 photodiodes 65 in each block are separated to the upper, lower, right, and left sides by the RDTI 62. That is, the FDTI 61 and the RDTI 62 are, for the same side surface of the photodiode 65, arranged next to each other in a direction (a transverse direction) perpendicular to the optical axis of a lens 67. Moreover, two side surfaces of the photodiode 65 are separated by the FDTI 61 and the RDTI 62, and the remaining two side surfaces of the photodiode 65 are separated by the FDTI 61 or the RDTI 62. Other configurations are similar to those in the case illustrated in B of FIG. 20.

(9) Configuration 6 of Still Another Combination of FDTI and RDTI

Figure 22:
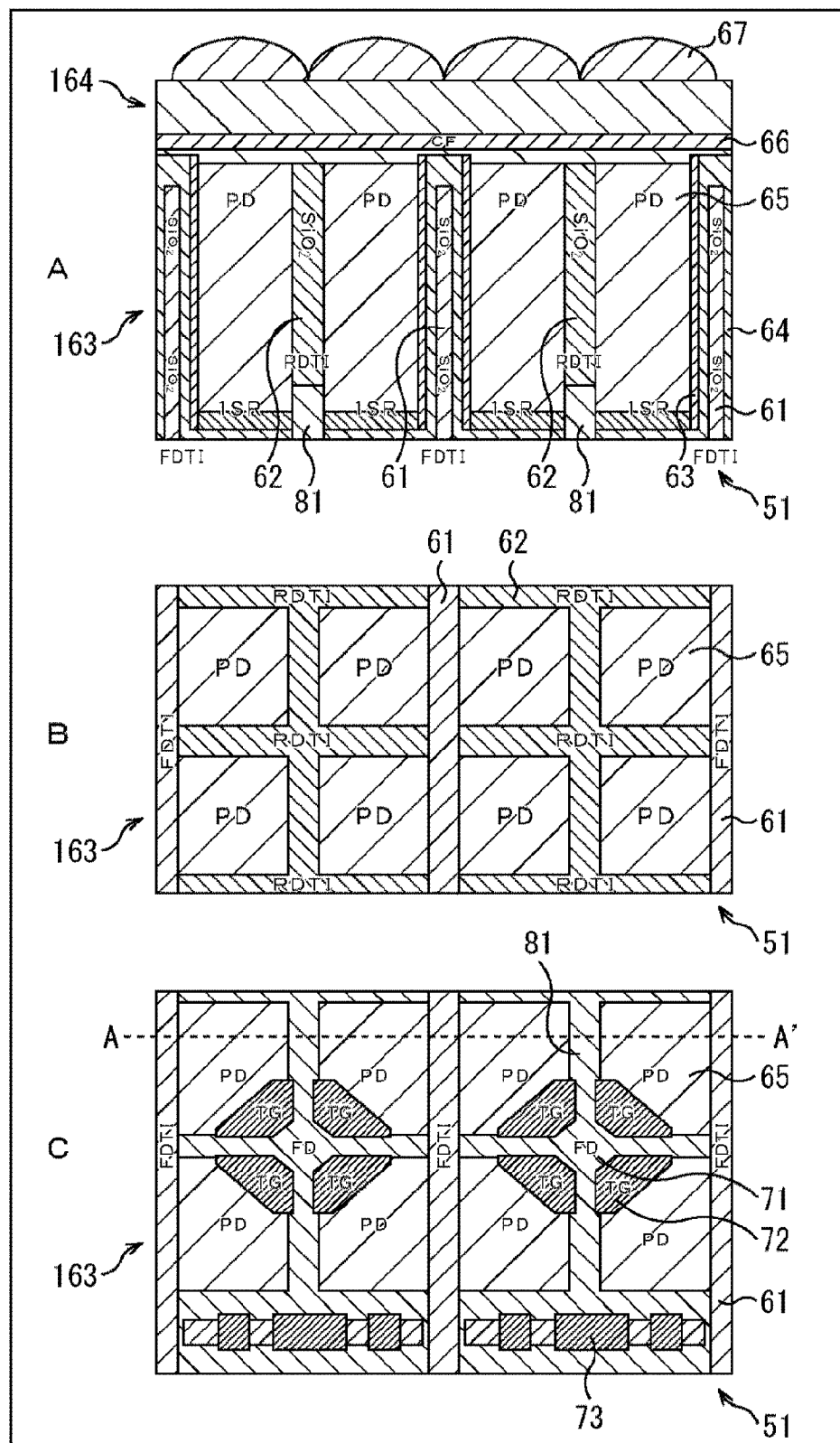
FIG. 22 is a view of the configuration of the solid-state imaging element of the first embodiment of the present technology.

FIG. 22 is a view of the configuration of the solid-state imaging element of the first embodiment of the present technology. B and C of FIG. 22 respectively illustrate the configurations of the back and front surfaces of the solid-state imaging element 51, and A of FIG. 22 illustrates a configuration of across section of the solid-state imaging element 51 along an A-A' line of C of FIG. 22.

In the solid-state imaging element 51 of the embodiment of FIG. 22, 2×2 photodiodes 65 on a back surface side form a single block, and the block is separated by a FDTI 61 at right and left boundaries and by a RDTI 62 at upper and lower boundaries as illustrated in B of FIG. 22.

In the block, separation by the RDTI 62 is made at a boundary between upper and lower sides and a boundary between right and left sides. Eventually, three side surfaces of the photodiode 65 are separated by the RDTI 62, and the remaining one side surface of the photodiode 65 is separated by the FDTI 61.

On a front surface side, 2×2 photodiodes 65 forms a single block, and the block is separated by the FDTI 61 at right and left boundaries as illustrated in C of FIG. 22. The block is separated by an impurity layer 81 at upper and lower boundaries.

In the block, separation by the impurity layer 81 is made at a boundary between the upper and lower sides and a boundary between the right and left sides. Eventually, three side surfaces of the photodiode 65 are separated by the impurity layer 81, and the remaining one side surface of the photodiode 65 is separated by the FDTI 61.

As illustrated in A of FIG. 22, a right or left end of each of four photodiodes 65 is separated by the FDTI 61 in the cross section along the A-A' line of C of FIG. 22. Moreover, two left photodiodes are separated from two right photo-diodes by the FDTI 61. The two left photodiodes 65 are separated by the RDTI 62 and the impurity layer 81, and the two right photo diodes 65 are separated by the RDTI 62 and the impurity layer 81.

Figure 23:
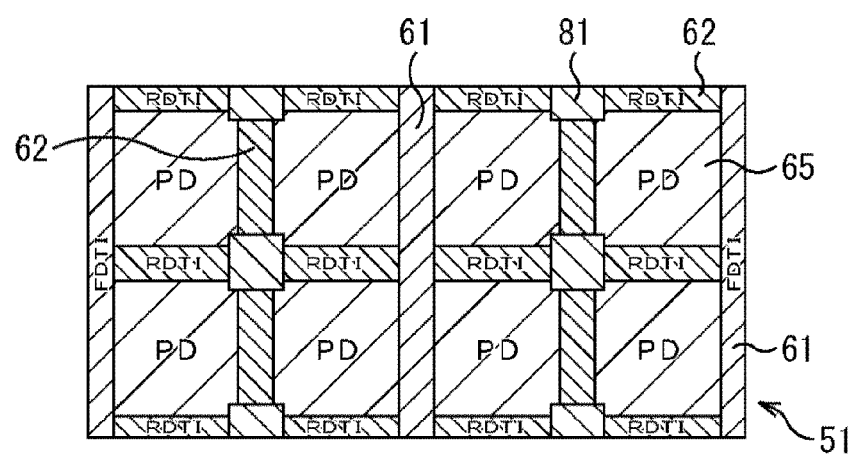
FIG. 23 is a view of the configuration of the solid-state imaging element of the first embodiment of the present technology.

FIG. 23 is a view of the configuration of the solid-state imaging element of the first embodiment of the present technology. The solid-state imaging element 51 illustrated in FIG. 22 can have a back surface configuration as illustrated in FIG. 23 instead of the configuration illustrated in B of FIG. 22. As clearly seen from comparison between FIG. 23 and B of FIG. 22, a configuration example of FIG. 23 is made such that an intersection portion between the RDTI 62 for separating the 2×2 photodiodes 65 to the upper and lower sides and the RDTI 62 for separating the 2×2 photodiodes 65 to the right and left sides is separated by the impurity layer 81. Other configurations are similar to those in the case illustrated in B of FIG. 22.

(10) Configuration 7 of Still Another Combination of FDTI and RDTI

Figure 24:
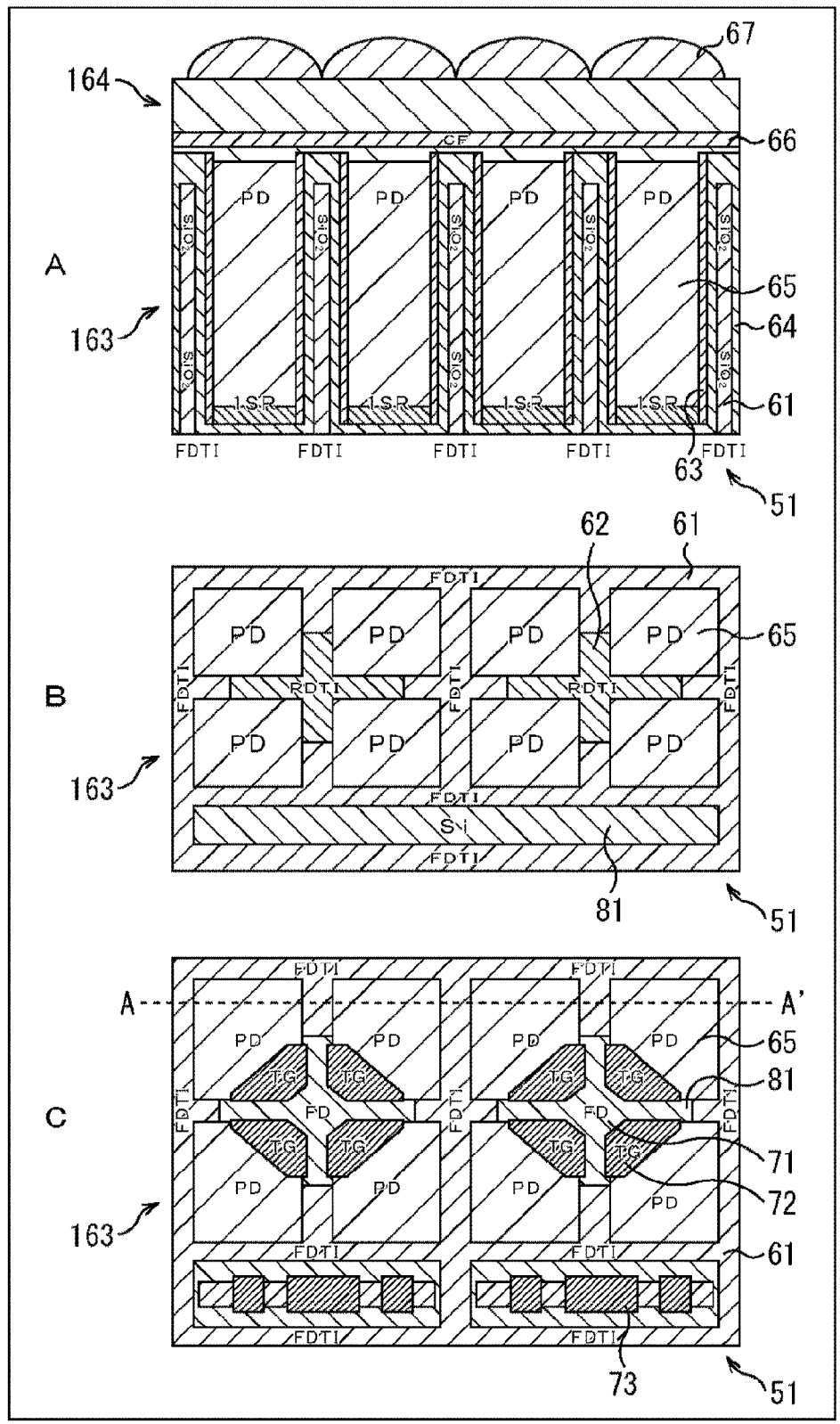
FIG. 24 is a view of the configuration of the solid-state imaging element of the first embodiment of the present technology.

FIG. 24 is a view of the configuration of the solid-state imaging element of the first embodiment of the present technology. B and C of FIG. 24 respectively illustrate the configurations of the back and front surfaces of the solid-state imaging element 51, and A of FIG. 24 illustrates a configuration of across section of the solid-state imaging element 51 along an A-A' line of C of FIG. 24.

In the solid-state imaging element 51 of the embodiment of FIG. 24, 2×2 photodiodes 65 on a back surface side form a single block, and each block is separated by a FDTI 61 at a boundary surrounding such a block as illustrated in B of FIG. 24. Moreover, in each block, right and left end portions at a boundary for separating the 2×2 photodiodes 65 to upper and lower sides and upper and lower end portions at a boundary for separating the 2×2 photodiodes 65 to right and left sides are separated by the FDTI 61. Further, center portions of the 2×2 photodiodes 65 are separated by a RDTI 62 at the boundary between the upper and lower sides and the boundary between the right and left sides. That is, two side surfaces of the photodiode 65 are separated by the FDTI 61 and the RDTI 62, and the remaining two side surfaces of the photodiode 65 are separated by the FDTI 61. The FDTI 61 and the RDTI 62 are arranged next to each other in a direction (a transverse direction) perpendicular to the optical axis of a lens 67 to face the same side surface of the photodiode 65.

On a front surface side, 2×2 photodiodes 65 also form a single block, and each block is also separated by the FDTI 61 at a boundary surrounding such a block as illustrated in C of FIG. 24. Moreover, in each block, right and left end portions at a boundary for separating the 2×2 photodiodes 65 to the upper and lower sides and upper and lower end portions at a boundary for separating the 2×2 photodiodes 65 to the right and left sides are separated by the FDTI 61. Further, the vicinity of the center of each block is separated by the impurity layer 81 at the boundary between the upper and lower sides and the boundary between the right and left sides.

As illustrated in A of FIG. 24, four photodiodes 65 are separated by the FDTI 61 in the cross section along the A-A' line of C of FIG. 24.

Figure 25:
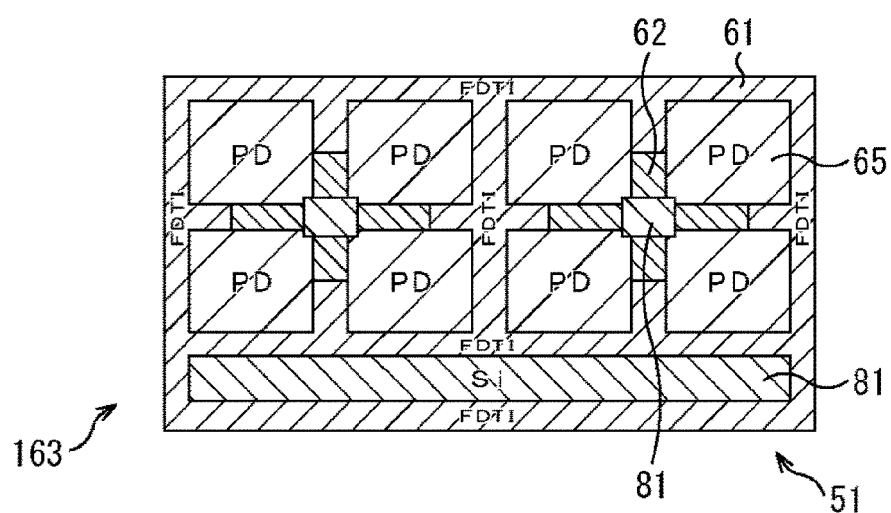
FIG. 25 is a view of the configuration of the solid-state imaging element of the first embodiment of the present technology.

FIG. 25 is a view of the configuration of the solid-state imaging element of the first embodiment of the present technology. The solid-state imaging element 51 illustrated in FIG. 24 can have a back surface configuration as illustrated in FIG. 25 instead of the configuration illustrated in B of FIG. 24. As clearly seen from comparison between FIG. 25 and B of FIG. 24, a configuration example of FIG. 25 is made such that an intersection portion between the RDTI 62 for separating the 2×2 photodiodes 65 to the upper and lower sides and the RDTI 62 for separating the 2×2 photodiodes 65 to the right and left sides in the vicinity of the center is formed of the impurity layer 81. Other configurations are similar to those in the case illustrated in B of FIG. 24.

Each side of the photodiode 65 can be separated by the FDTI 61 or the RDTI 62 alone or by a combination thereof. For the pixel transistor 73 and the FD 71 susceptible to area restriction, the FDTI 61 and the RDTI 62 can be used differently. Thus, the area of the photodiode 65 can be ensured, color mixture can be reduced, and the saturated charge amount Qs can be improved.

As described above, according to the present technology, at least one or more sides of the photodiode 65 are separated by the FDTI 61 or the RDTI 62. Thus, reliable light shielding can be realized, and color mixture can be reduced. Even for a pixel with a great silicon film thickness, a light shielding effect can be improved. A portion separated by the FDTI 61 and the RDTI 62 is selected so that the area of the photodiode 65 can be ensured.

Moreover, the N-type impurity layer 63 and the P-type impurity layer 64 are formed in the FDTI 61 by solid-phase diffusion, and therefore, the intense electric field portion can be formed on the surface of the FDTI 61. Thus, the saturated charge amount Qs can be improved.

Note that in description above, the impurity layer 63 formed of the N-type impurity and the impurity layer 64 formed of the P-type impurity are formed by solid-phase diffusion, but can be formed by other methods. For example, these layers can be formed by tilt ion implantation, plasma doping, epitaxial growth, vapor-phase diffusion, etc.

Second Embodiment (FDTI)

Figure 26:
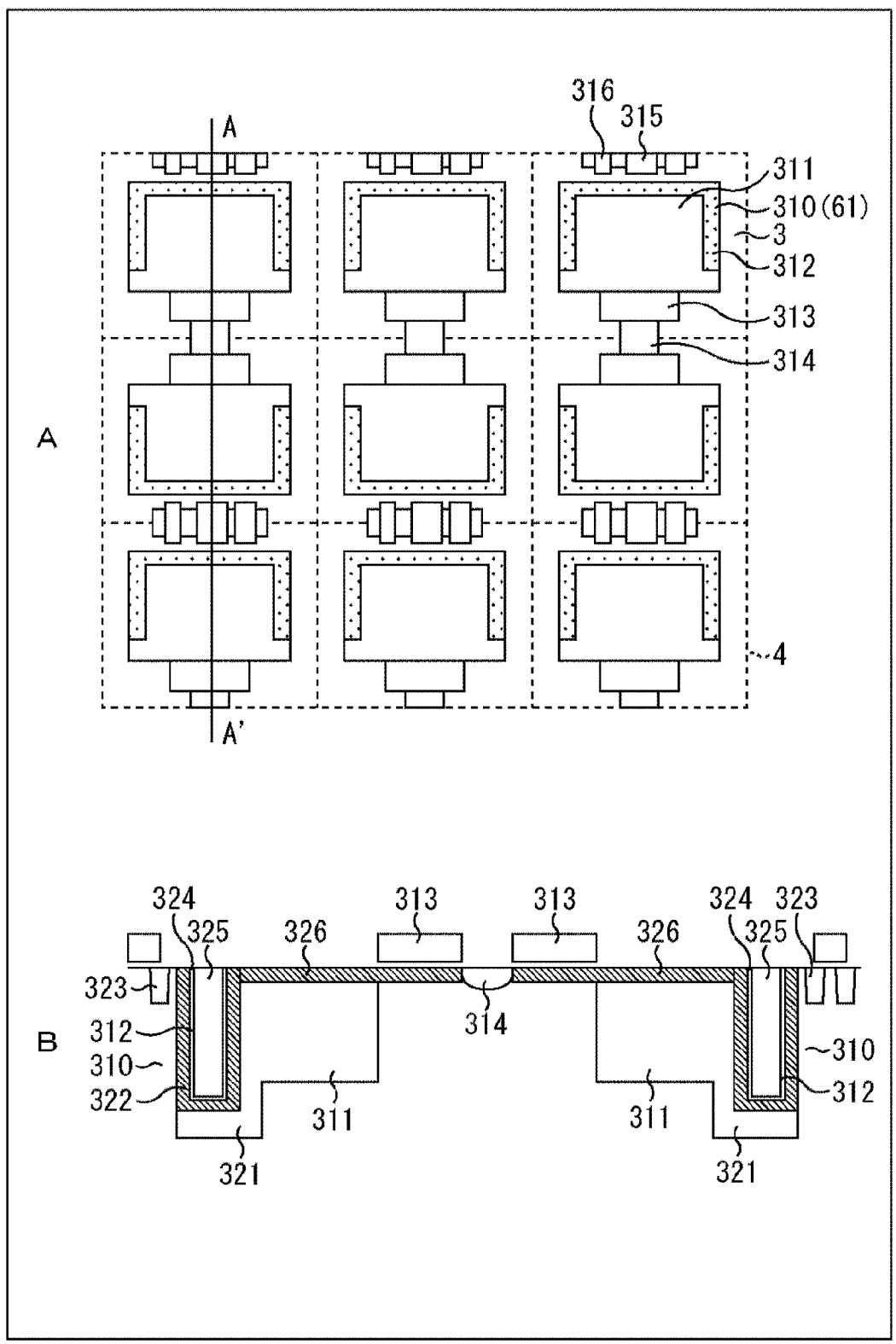
FIG. 26 is a view of a configuration of a solid-state imaging element of a second embodiment of the present technology.
Figure 27:
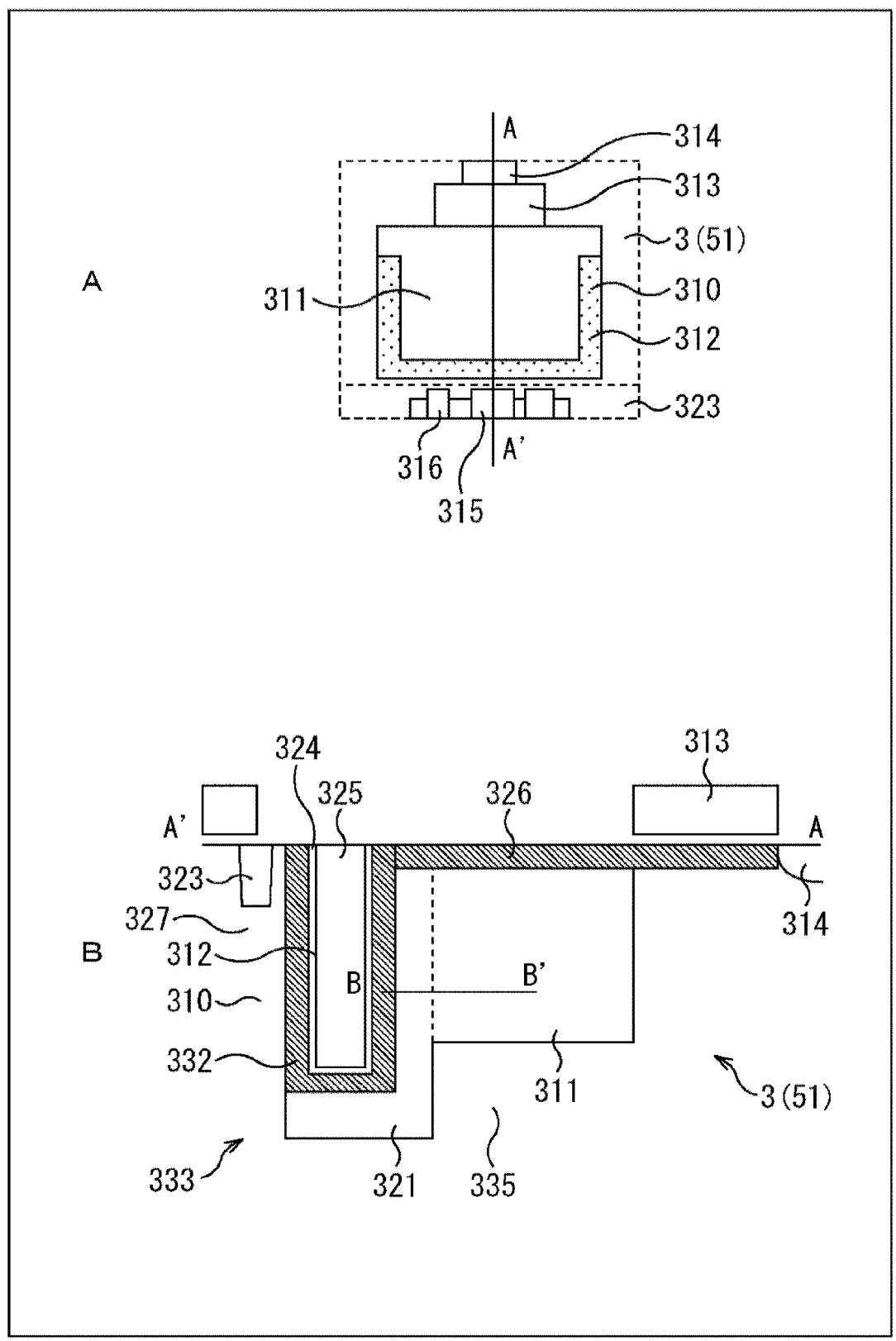
FIG. 27 is a view of the configuration of the solid-state imaging element of the second embodiment of the present technology.
Figure 28:
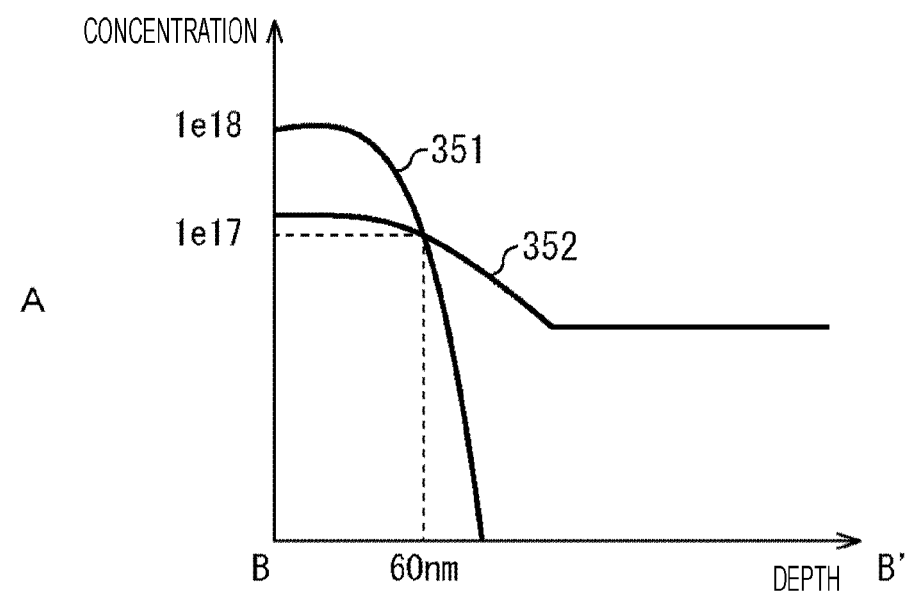
FIG. 28 is a graph for describing characteristics of the solid-state imaging element of the second embodiment of the present technology.
Figure 28:
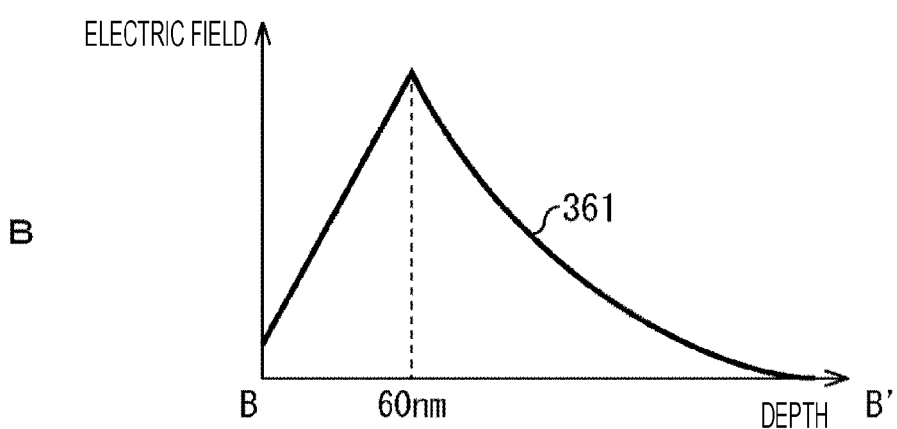

(1) Configuration of FDTI (FIG. 26, FIG. 27, FIG. 28)

FIG. 26 and FIG. 27 are views of a configuration of a solid-state imaging element of a second embodiment of the present technology. These figures illustrate a configuration of an individual imaging element 51. B of FIG. 26 illustrates a configuration of a cross section along an A-A' line of A of FIG. 26. A of FIG. 27 illustrates a partial configuration (a single pixel 3) of A of FIG. 26, and B of FIG. 27 illustrates a configuration of a cross section along an A-A' line of A of FIG. 27. Note that although not shown in these figures, the lenses 67 illustrated in, e.g., A of FIG. 2 and B of FIG. 7 are arranged on the lower side as viewed in B of FIG. 26 and B of FIG. 27.

In the second embodiment, the FDTI 61 of the FDTI 61 and the RDTI 62 of the first embodiment will be mainly described. That is, in the second embodiment, the solid-state imaging element 51 is also configured such that a wiring layer 162 is disposed on a first surface side (a front surface side) of a semiconductor layer 163 and an optical layer 164 is disposed on a second surface side (a back surface side) facing a first surface as illustrated in B of FIG. 7. Moreover, a configuration of the FDTI 61 formed in the semiconductor layer 163 will be described.

Note that in the second embodiment, the wiring layer 162, the semiconductor layer 163, and the optical layer 164 are not specifically shown in the figures, but these terms will be used as necessary.

A of FIG. 26 illustrates a partial configuration (3×3 pixels 3) of the pixel region 4 of FIG. 1. As illustrated in A of FIG. 26 and A of FIG. 27, a photodiode 311 (corresponding to the photodiode 65 of the first embodiment) is disposed at the substantially center of the pixel 3 on the front surface side. Moreover, a transfer gate 313 (corresponding to the TG 72 of the first embodiment) and an N-type floating diffusion 314 (corresponding to the FD 71 of the first embodiment) are arranged in the vicinity (the upper side as viewed in A of FIG. 27) of the photodiode 311.

On the lower side of the photodiode 311 as viewed in A of FIG. 27, a STI 323 (corresponding to the STI 191 of the first embodiment), a pixel transistor 315 (corresponding to 73 of the first embodiment), and gate polysilicon 316 are arranged.

A trench 312 (corresponding to the trench 111 of the first embodiment) is continuously formed at the entirety of the lower side of the photodiode 311, part of the left side of the photodiode 311, and part of the right side of the photodiode 311 as viewed in A of FIG. 27. The trench 312 is a trench for a FDTI 310 (corresponding to the FDTI 61 of the first embodiment).

As viewed in the cross-sectional configuration illustrated in B of FIG. 27, the trench 312 is formed on the left side of the N-type photodiode 311. Moreover, an N-type impurity layer 321 (corresponding to the impurity layer 63 of the first embodiment) is formed at the periphery of the trench 312, and a P-type impurity layer 332 (corresponding to the impurity layer 64 of the first embodiment) is further formed inside (a side close to the trench 312) the impurity layer 321. As described in the first embodiment, these layers are formed by solid-phase diffusion. The N-type impurity layer 321 is connected to the N-type photodiode 311. A P-type well 335 is formed below the N-type photodiode 311.

FIG. 28 is a graph for describing characteristics of the solid-state imaging element of the second embodiment of the present technology. A of FIG. 28 shows an impurity concentration profile in a cross section (i.e., a PN joint portion) along a B-B' line of B of FIG. 27, the vertical axis representing a concentration and the horizontal axis representing a depth on the B-B' line (at a position in the transverse direction as viewed in B of FIG. 27). A peak P-type impurity concentration shown by a curve 351 is, e.g., 1e18/cm3 (a value within a range of 1e17 to 1e19/cm3). A peak N-type impurity concentration at the PN joint portion as shown by a curve 352 is, e.g., 1e17/cm3 (a value within a range of 1e16 to 1e18/cm3). The depth (the depth at an intersection between the curve 351 and the curve 352) at the PN joint is, e.g., 60 nm (a value within a range of 2 to 150 nm).

According to solid-phase diffusion, a steep profile can be produced at a side surface of the trench 312 as a diffusion source. Thus, a steep PN joint can be formed. As a result, an N-type impurity concentration increases, leading to an intense electric field. Thus, a saturated charge amount Qs can be increased. B of FIG. 28 shows electric field distribution at the PN joint portion, the vertical axis representing an electric field and the horizontal axis representing the depth on the B-B' line. A curve 361 shows an electric field intensity on the B-B' line, and shows that the electric field reaches its peak at a depth of 60 nm. The electric field can be intensified, and therefore, the depth can be shallower (in the present embodiment, the depth can be 60 nm). Thus, the photodiode 311 can be expanded.

A thermally-oxidized film (a silicon oxide film) 324 with 5 nm (a value within a range of 2 to 20 nm) is, for example, formed at a Si interface of the trench 312, and an embedded film (a silicon oxide film) 325 formed by CVD is embedded in the trench 312. A region 327 on the opposite side of the trench 312 from the transfer gate 313 is of an N-type when the N-type impurity layer 321 is formed by solid-phase diffusion. Thus, this region 327 becomes a P-type by additional ion implantation of a P-type impurity (e.g., boron).

In such a structure, the PN joint is close to the interface of the trench 312, and therefore, there is a probability that the Si interface of the trench 312 is susceptible to influence of a depletion layer electric field of the PN joint portion. That is, an end portion of a depletion layer formed between the N-type impurity layer 321 and the P-type impurity layer 332 in the vicinity of the Si interface comes into contact with the Si interface, and therefore, a weak electric field is applied to the Si interface. However, the Si interface of the trench 312 is the thermally-oxidized film 324, and therefore, an interface state is reduced. Dark current and white spots can be suppressed to such a level that no problem is caused in imaging characteristics. As described above, the depth of the PN joint can be shallowed to about 60 nm, and a wide area of the photodiode 311 can be obtained. Thus, the saturated charge amount Qs can be increased.

Figure 29:
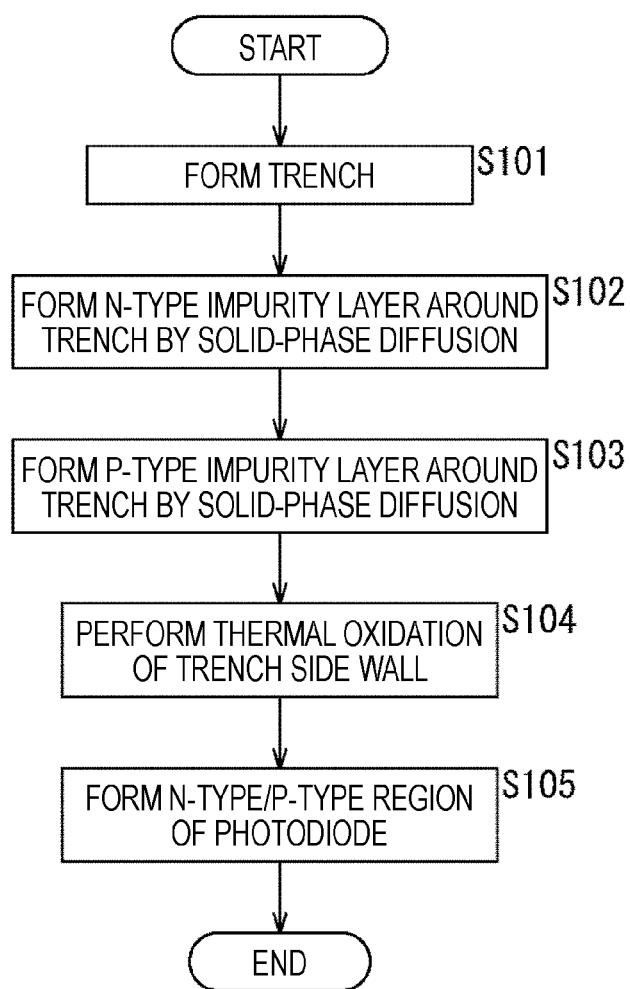
FIG. 29 is a flowchart for describing the method for manufacturing the solid-state imaging element of the second embodiment of the present technology.
Figure 30:
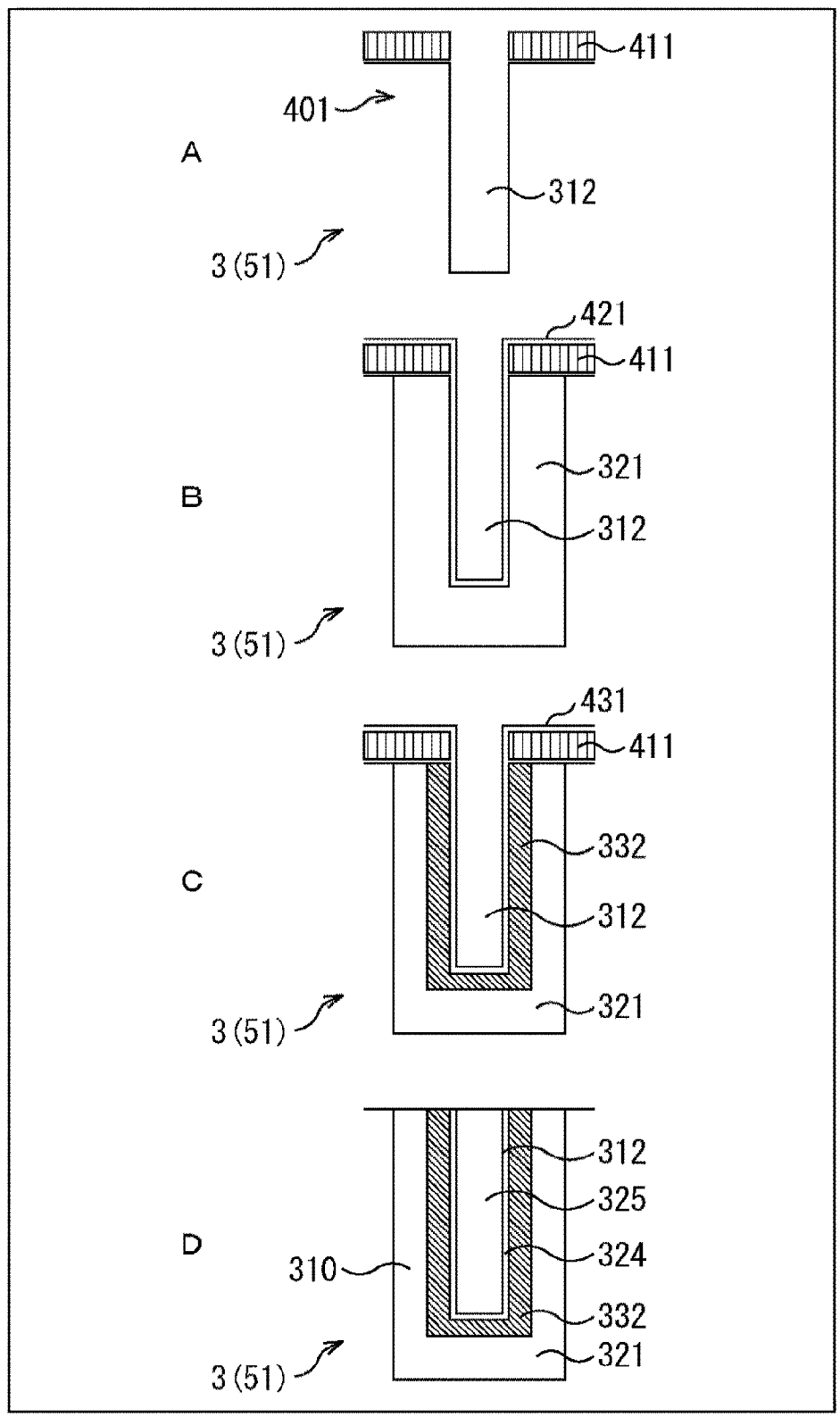
FIG. 30 is a view for describing the method for manufacturing the solid-state imaging element of the second embodiment of the present technology.
Figure 31:
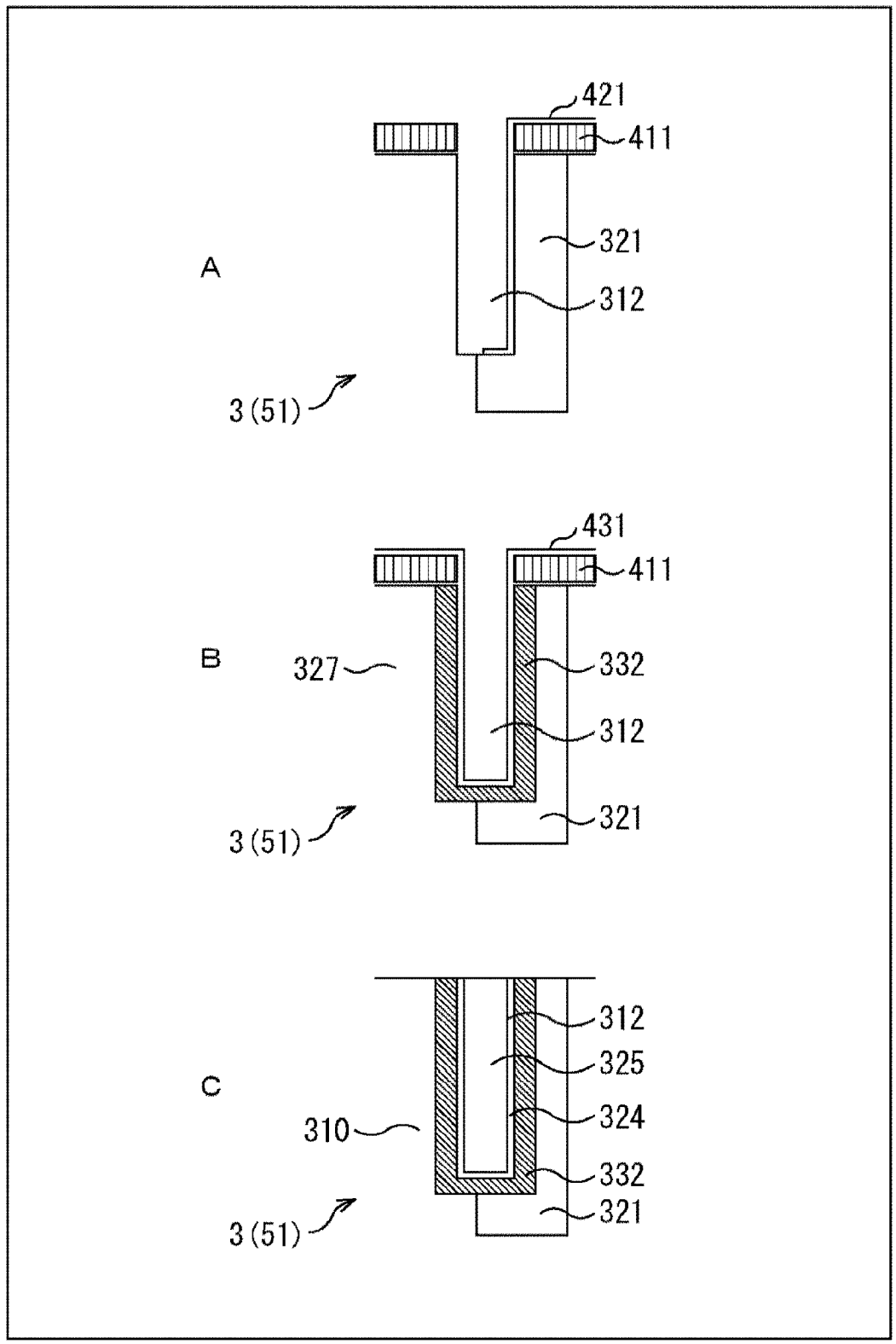
FIG. 31 is a view for describing the method for manufacturing the solid-state imaging element of the second embodiment of the present technology.

(2) Method for Manufacturing FDTI (FIG. 29, FIG. 30, FIG. 31)

Next, the method for manufacturing the individual imaging element 51 will be described with reference to FIG. 29 and FIG. 30. FIG. 29 is a flowchart for describing the method for manufacturing the solid-state imaging element of the second embodiment of the present technology, and FIG. 30 is a view for describing the method for manufacturing the solid-state imaging element of the second embodiment of the present technology.

First, the processing of forming a trench 312 is executed at a step S101. That is, e.g., a silicon substrate 401 (corresponding to the substrate 101 of FIG. 4 of the first embodiment) is prepared, and a silicon nitride film 411 for masking is formed on a surface of the substrate 401. Then, the trench 312 is, using the silicon nitride film 411 as a mask, formed from a front surface side by lithography and etching (A of FIG. 30).

As in the case of B of FIG. 4 of the first embodiment, a front surface side (i.e., a side on which a wiring layer 162 is to be disposed) of a semiconductor layer 163 is in an upward direction in A of FIG. 30. That is, the trench 312 is formed from the front surface side (the side on which the wiring layer 162 is to be disposed) of the semiconductor layer 163.

At a step S102, the processing of forming an N-type impurity layer 321 at the periphery of the trench 312 by solid-phase diffusion is executed. That is, e.g., a phosphorus-doped silicon oxide film 421 doped with phosphorus (P) as an N-type impurity is formed, and the N-type impurity layer 321 is formed at the periphery of the trench 312 by heat treatment (B of FIG. 30). Thereafter, the phosphorus-doped silicon oxide film 421 is removed. Then, by heat treatment, a broad phosphorus profile in a silicon substrate 401 is provided.

At a step S103, the processing of forming a P-type impurity layer 332 at the periphery of the trench 312 by solid-phase diffusion is executed. That is, e.g., a boron-doped silicon oxide film 431 doped with boron (B) as a P-type impurity is formed, and the P-type impurity layer 332 is formed at the periphery of the trench 312 by heat treatment (C of FIG. 30). Thereafter, the boron-doped silicon oxide film 431 is removed.

At a step S104, the processing of performing thermal oxidation of a side wall of the trench 312 is executed. That is, e.g., a thermally-oxidized film (a silicon oxide film) 324 with a thickness of 5 nm is formed on the side wall of the trench 312 by thermal oxidation. Further, an embedded film (a silicon oxide film) 325 is embedded in the trench 312 by a CVD method (D of FIG. 30). In this manner, a FDTI 310 is formed.

At a step S105, the processing of forming an N-type/P-type region of a photodiode 311 is executed. That is, ion implantation of an N-type impurity into the photodiode 311 is performed. Further, a region 327 on the opposite side of the trench 312 from a transfer gate 313 becomes a P-type by ion implantation of a P-type impurity.

That is, when the N-type impurity 321 is formed by solid-phase diffusion, the type of region 327 which becomes an N-type by doping is canceled by ion implantation of the P-type impurity, and becomes the P-type. Moreover, according to a normal manufacturing method, a gate electrode is formed.

Note that the above-described manufacturing steps of FIG. 30 can be those illustrated in FIG. 31. FIG. 31 is a view for describing the method for manufacturing the solid-state imaging element of the second embodiment of the present technology.

That is, after the step of A of FIG. 30, the phosphorus-doped silicon oxide film 421 is formed at the step of B of FIG. 30. Then, before heat treatment, the phosphorus-doped silicon oxide film 421 can be selectively removed. That is, as illustrated in A of FIG. 31, a portion of the phosphorus-doped silicon oxide film 421 on the opposite side (the left side as viewed in A of FIG. 31) of the transfer gate 313 in the trench 312 is selectively removed by lithography and etching.

Thereafter, the N-type impurity layer 321 is formed only on an inner side wall portion of the trench 312 close to the transfer gate 313 (the right side as viewed in A of FIG. 31) by solid-phase diffusion by heat treatment (A of FIG. 31). Then, as described with reference to C of FIG. 30, the boron-doped silicon oxide film 431 is formed in the trench 312, and solid-phase diffusion is performed by heat treatment to form the P-type impurity layer 332 (B of FIG. 31).

Further, the thermally-oxidized film (the silicon oxide film) 324 is formed on the side wall of the trench 312 by thermal oxidation of the side wall of the trench 312. Then, the embedded film (the silicon oxide film) 325 is embedded in the trench 312 by the CVD method (C of FIG. 31).

In this case, the portion of the phosphorus-doped silicon oxide film 421 on the opposite side (the left side as viewed in A of FIG. 31) of the transfer gate 313 in the trench 312 is selectively removed, and therefore, the N-type impurity layer 321 is not formed in the region 327 on the opposite side (i.e., a side close to a STI 323) of the trench 312 from the transfer gate 313 (B of FIG. 31). That is, only the P-type impurity layer 332 is formed, and therefore, the step of converting, by ion implantation of the P-type impurity, the region 327 on the opposite side of the trench 312 from the transfer gate 313 back into the P-type as performed at the step S105 of FIG. 29 can be omitted.

Figure 32:
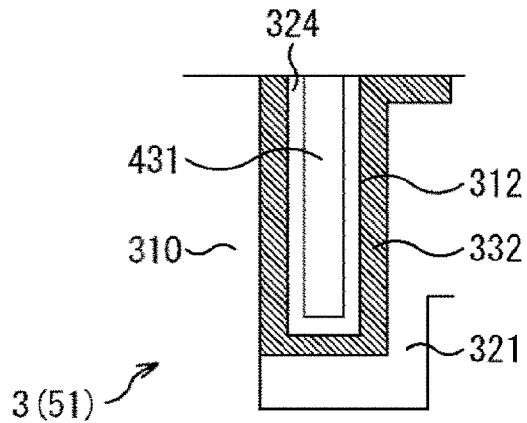
FIG. 32 is a view of the configuration of the solid-state imaging element of the second embodiment of the present technology.

(3) Another Configuration 1 of FDTI (FIG. 32) FIG. 32 is a view of the configuration of the solid-state imaging element of the second embodiment of the present technology. In a pixel 3 of a solid-state imaging element 51 of FIG. 32, an embedded film 431 embedded in a trench 312 is formed of polysilicon or silicon nitride with a doped impurity amount of equal to or less than 1e16/cm3. Other configurations are similar to those in the case of B of FIG. 27. The polysilicon or the silicon nitride exhibits better embedding characteristics than those of a silicon oxide film. Thus, such a material exhibits similar electric characteristics, but exhibits improved embedding characteristics as compared to the case of B of FIG. 27.

Figure 33:
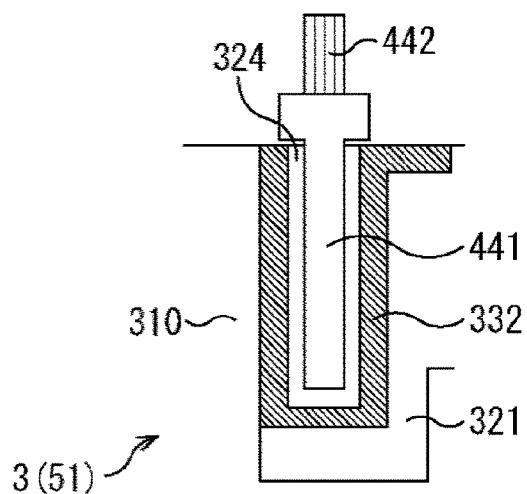
FIG. 33 is a view of the configuration of the solid-state imaging element of the second embodiment of the present technology.

(4) Still Another Configuration 2 of FDTI (FIG. 33)

FIG. 33 is a view of the configuration of the solid-state imaging element of the second embodiment of the present technology. In a pixel 3 of FIG. 33, an embedded film 441 embedded in a trench 312 is formed of polysilicon or metal with a doped phosphorus impurity amount of equal to or greater than 1e16/cm3 and equal to or less than 1e23/cm3, for example. Then, e.g., a voltage of −1.2 V is applied to the embedded film 441 from a contact 442.

By negative potential application to the polysilicon, holes are concentrated on an interface of the trench 312 of a silicon substrate. Electrons generated at the interface of the trench 312 are introduced into the holes before flowing into a photodiode 311. This reduces occurrence of dark current and white spots.

Figure 34:
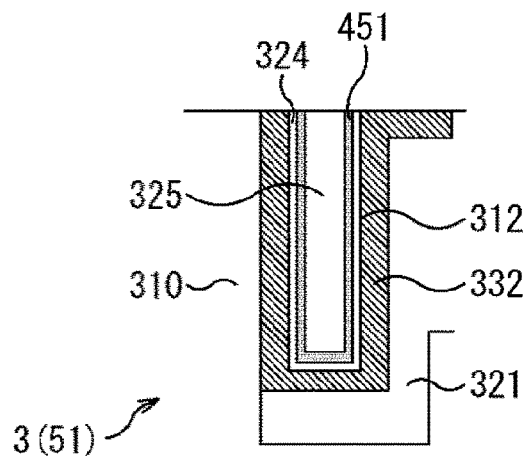
FIG. 34 is a view of the configuration of the solid-state imaging element of the second embodiment of the present technology.

(5) Still Another Configuration 3 of FDTI (FIG. 34)

FIG. 34 is a view of the configuration of the solid-state imaging element of the second embodiment of the present technology. In a pixel 3 of FIG. 34, a fixed charge film 451 with a negative fixed charge is formed on a thermally-oxidized film 324 in a trench 312. Thereafter, a silicon oxide film is embedded as an embedded film 325 in the trench 312.

Because of the presence of the fixed charge film 451 with the negative fixed charge, holes are concentrated on an interface of the trench 312 of a silicon substrate, and electrons generated at the interface of the trench 312 are introduced into the holes before flowing into a photodiode 311. This reduces occurrence of dark current and while spots.

The fixed charge film 451 with the negative fixed charge is, for example, formed of a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The above-described types of films have a track record in use for a gate insulating film etc. of an insulating gate type field-effect transistor, and therefore, a film formation method has been established. Thus, these types of films can be easily formed. For example, a chemical vapor deposition method, a sputtering method, an atomic layer deposition method, etc. can be used as the film formation method.

Moreover, e.g., lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$) can be used as other materials than above.

Further, the fixed charge film 451 with the negative fixed charge can be formed of a hafnium nitride film, an aluminum nitride film, a hafnium oxynitride film, or an aluminum oxynitride film. For these films, the chemical vapor deposition method, the sputtering method, the atomic layer deposition method, etc. can be also used, for example. However, the atomic layer deposition method can be preferably used because a $SiO_2$ layer for reducing an interface state during film formation can be simultaneously formed to about 1 nm.

Figure 35:
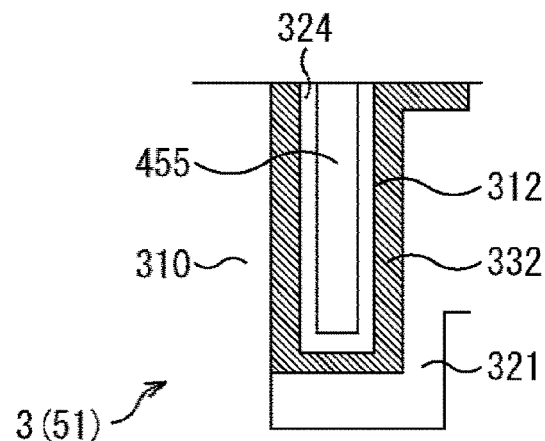
FIG. 35 is a view of the configuration of the solid-state imaging element of the second embodiment of the present technology.

(6) Still Another Configuration 4 of FDTI (FIG. 35)

FIG. 35 is a view of the configuration of the solid-state imaging element of the second embodiment of the present technology. In a pixel 3 of FIG. 35, a cavity 455 is formed in a trench 312. That is, in this example, no embedded film is present. Thus, the number of steps is reduced by the absence of the embedded film, leading to an efficient manufacturing step.

Figure 36:
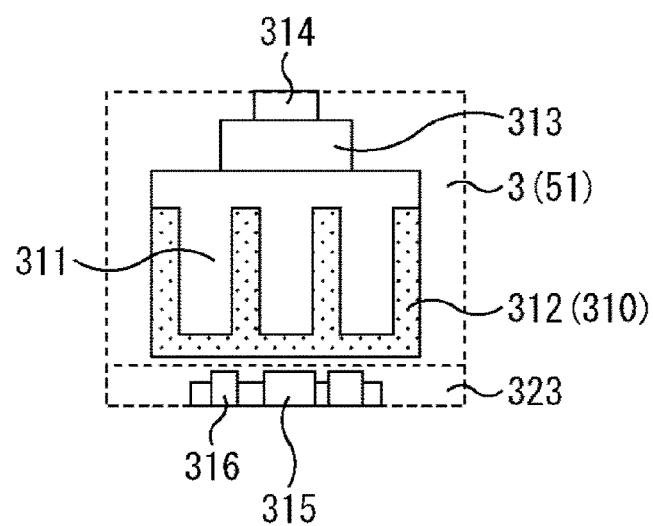
FIG. 36 is a view of the configuration of the solid-state imaging element of the second embodiment of the present technology.

(7) Still Another Configuration 5 of FDTI (FIG. 36)

FIG. 36 is a view of the configuration of the solid-state imaging element of the second embodiment of the present technology. In a pixel 3 of FIG. 36, a trench 312 (therefore, a FDTI 310) is formed in such a comb-tooth shape that the trench 312 not only extends at the outer periphery of a photodiode 311, but also continuously extends from the outer periphery into the photodiode 311 to bite into the photodiode 311 in a line shape.

In this case, the surface area of the trench 312 (therefore, the photodiode 311) is increased, and therefore, a saturated charge amount Qs can be increased.

Figure 37:
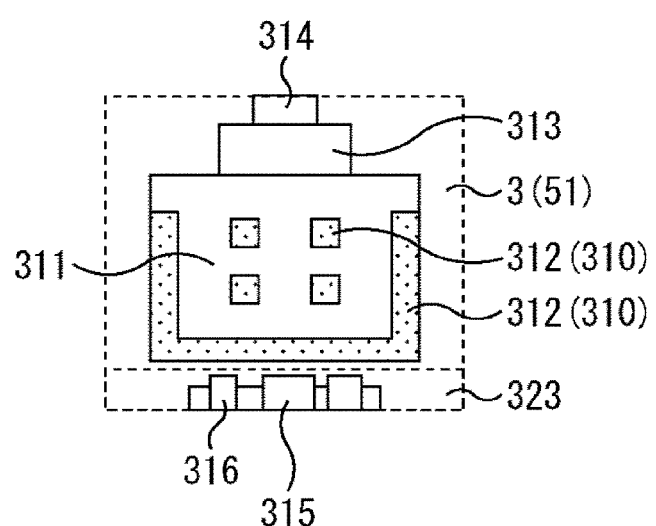
FIG. 37 is a view of the configuration of the solid-state imaging element of the second embodiment of the present technology.

(8) Still Another Configuration 6 of FDTI (FIG. 37)

FIG. 37 is a view of the configuration of the solid-state imaging element of the second embodiment of the present technology. In a pixel 3 of FIG. 37, a trench 312 (therefore, a FDTI 310) is not only formed at the outer periphery of a photodiode 311, but also is formed non-continuously with the outer periphery in an island shape in the photodiode 311.

In this case, the surface area of the trench 312 is also increased, and therefore, a saturated charge amount Qs can be increased.

Figure 38:
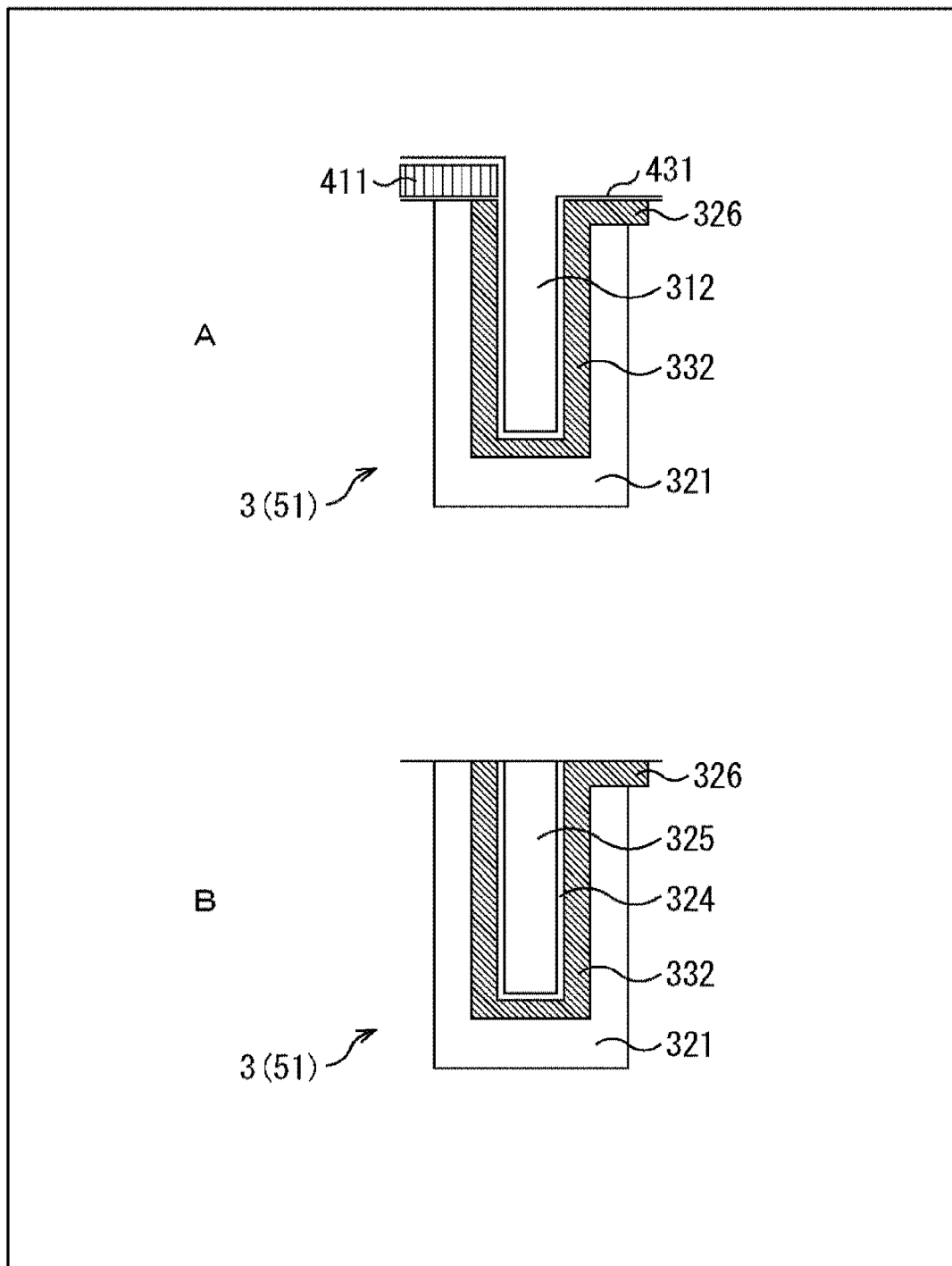
FIG. 38 is a view of the configuration of the solid-state imaging element of the second embodiment of the present technology.

(9) Still Another Configuration 7 of FDTI (FIG. 38)

FIG. 38 is a view of the configuration of the solid-state imaging element of the second embodiment of the present technology. In a pixel 3 of FIG. 38, a P-type layer 326 is also formed on a surface of a photodiode 311 by solid-phase diffusion. That is, as clearly seen from comparison between A of FIG. 38 and C of FIG. 30, when a boron-doped silicon oxide film 431 is formed for solid-phase diffusion of a P-type impurity layer 332, a silicon nitride film 411 for masking is not formed at a portion of a trench 312 on the right side as viewed in the figure (A of FIG. 38). As a result, when solid-phase diffusion of the P-type impurity layer 332 into a silicon substrate 401 from the trench 312 is performed by heat treatment, solid-phase diffusion is also performed for the surface of the photodiode 311 from the boron-doped silicon oxide film 431, and the P-type layer 326 is formed (B of FIG. 38).

In this case, as compared to a case where the P-type layer 326 on the surface of the N-type photodiode 311 is formed by ion implantation, no damage due to ion implantation is caused at the surface of the N-type photodiode 311, and therefore, worsening of dark current and white spots is reduced.

Figure 39:
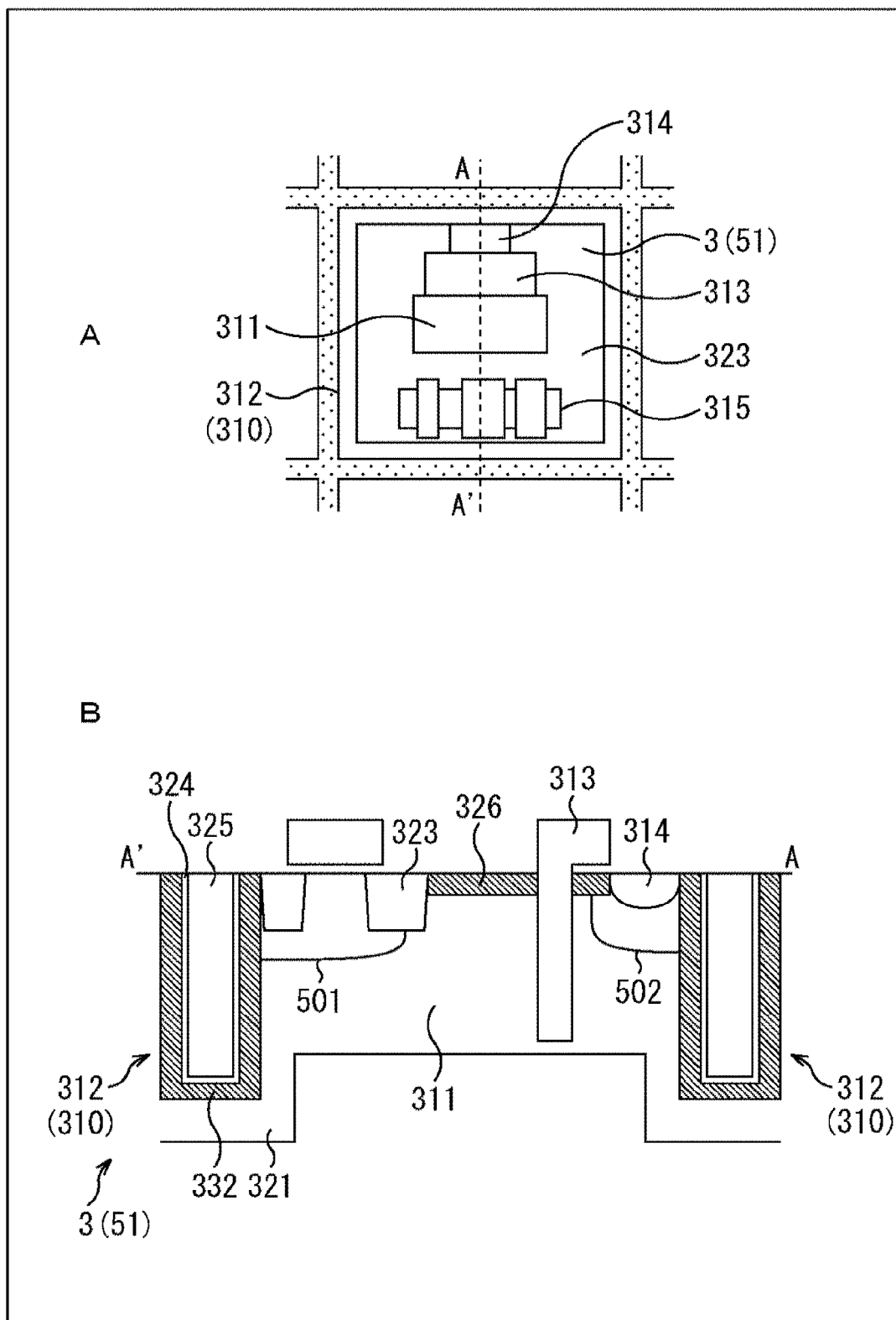
FIG. 39 is a view of the configuration of the solid-state imaging element of the second embodiment of the present technology.

(10) Still Another Configuration 8 of FDTI (FIG. 39)

FIG. 39 is a view of the configuration of the solid-state imaging element of the second embodiment of the present technology. B of FIG. 39 illustrates a configuration of a cross section along an A-A' line of A of FIG. 39. As viewed in B of FIG. 39, a P-type well 501 is formed above an N-type photodiode 311 on the right side of a left trench 312, and a P-type well 502 is formed above the N-type photodiode 311 on the left side of a right trench 312. Moreover, in a pixel 3 of FIG. 39, the trench 312 (therefore, a FDTI 310) is formed surrounding the periphery of the pixel 3 as illustrated in A of FIG. 39. That is, a pixel transistor 315 is disposed in the pixel 3, and the trench 312 is formed between adjacent pixels 3.

In this case, the surface area of the trench 312 is also increased, and therefore, a saturated charge amount Qs can be increased.

Figure 40:
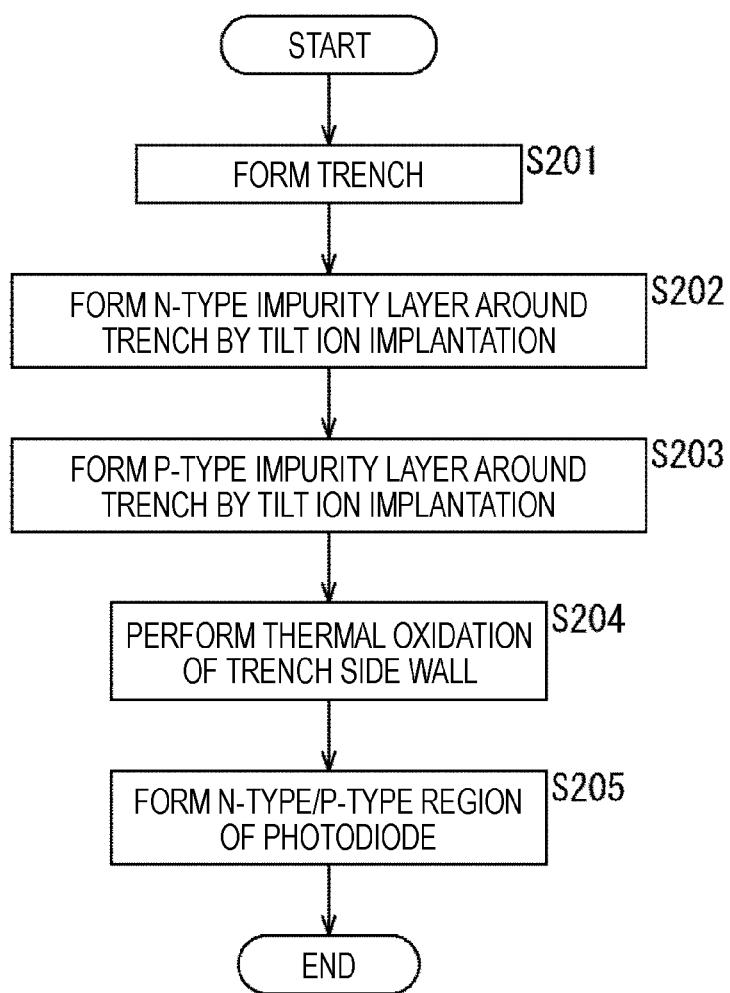
FIG. 40 is a flowchart for describing the method for manufacturing the solid-state imaging element of the second embodiment of the present technology.
Figure 41:
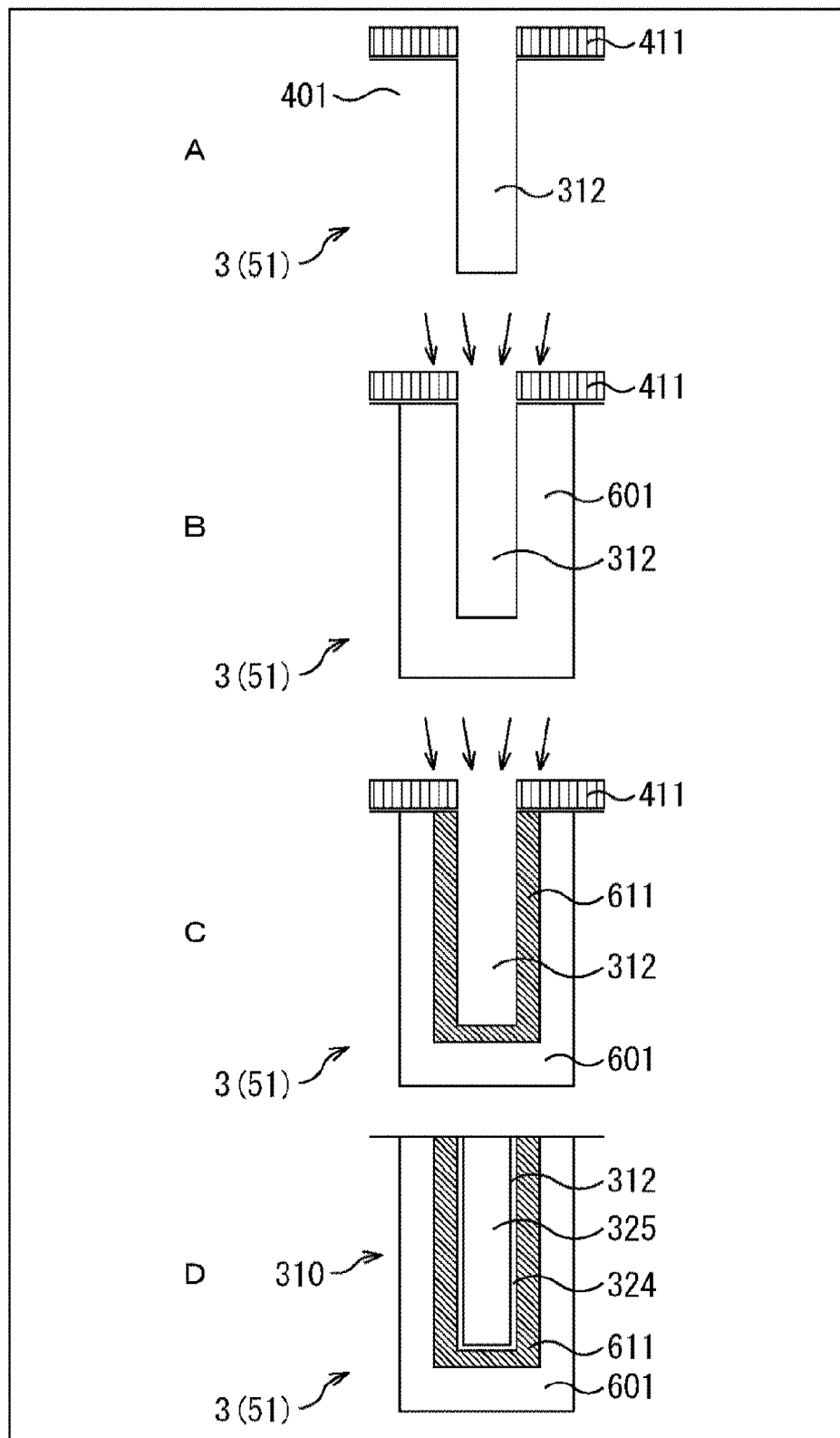
FIG. 41 is a view for describing the method for manufacturing the solid-state imaging element of the second embodiment of the present technology.

(11) Another Method for Manufacturing FDTI (FIG. 40, FIG. 41)

Next, another method for manufacturing the FDTI 310 will be described. FIG. 40 is a flowchart for describing the method for manufacturing the solid-state imaging element of the second embodiment of the present technology, and FIG. 41 is a view for describing the method for manufacturing the solid-state imaging element of the second embodiment of the present technology.

First, the processing of forming a trench 312 is executed at a step S201. That is, a silicon substrate 401 is prepared, and a silicon nitride film 411 for masking is formed on a surface of the silicon substrate 401. Then, the trench 312 is formed using the silicon nitride film 411 as a mask by lithography and etching (A of FIG. 41).

At a step S202, the processing of forming an N-type impurity layer 601 at the periphery of the trench 312 by tilt ion implantation is executed. That is, tilt ion implantation of phosphorus (P) into the trench 312 is performed, for example. Thereafter, a broad phosphorus profile in the silicon substrate 401 is provided by heat treatment (B of FIG. 41).

At a step S203, the processing of forming a P-type impurity layer 611 at the periphery of the trench 312 by tilt ion implantation is executed. That is, tilt ion implantation of boron (B) into the trench 312 is performed, for example. In this manner, the P-type impurity layer 611 is formed on the N-type impurity layer 601 (C of FIG. 41).

At a step S204, the processing of performing thermal oxidation of a side wall of the trench 312 is executed. That is, e.g., a thermally-oxidized film (a silicon oxide film) 324 with a thickness of 5 nm is formed on the side wall of the trench 312 by thermal oxidation. Further, an embedded film (a silicon oxide film) 325 is embedded in the trench 312 by a CVD method (D of FIG. 41). In this manner, a FDTI 310 is formed.

At a step S205, the processing of forming an N-type/P-type region of a photodiode 311 is executed. That is, ion implantation of an N-type impurity into the photodiode 311 is performed. Further, a region 327 on the opposite side of the trench 312 from a transfer gate 313 becomes a P-type by ion implantation of a P-type impurity.

That is, when the N-type impurity 321 is formed by solid-phase diffusion, the type of region 327 which becomes an N-type by doping is canceled by ion implantation of the P-type impurity, and becomes the P-type. Moreover, according to a normal manufacturing method, a gate electrode is formed.

Alternatively, the N-type impurity layer 601 and the P-type impurity layer 611 can be, in addition to tilt ion implantation, formed by plasma doping, epitaxial growth, vapor-phase diffusion, etc.

Figure 42:
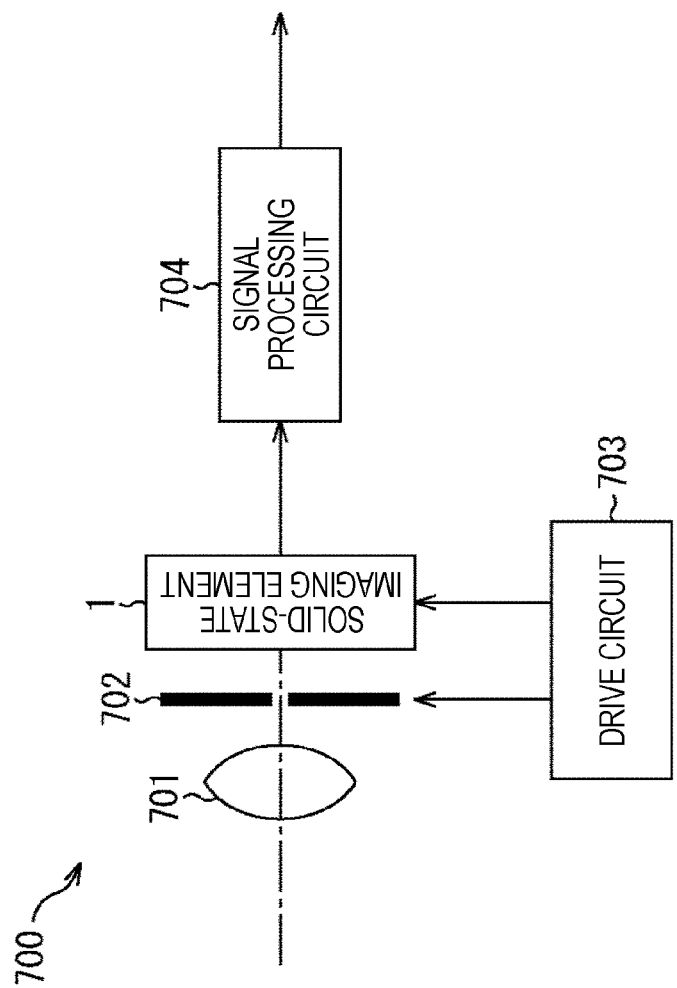
FIG. 42 is a diagram for describing a configuration of an electronic apparatus of a third embodiment of the present technology.

Third Embodiment (Electronic Apparatus Using Solid-State Imaging Element) (FIG. 42)

The solid-state imaging element of the present technology as described in the embodiments above is applicable to an electronic apparatus including, for example, camera systems such as a digital camera and a video camera, mobile phones having an imaging function, and other types of equipment having an imaging function. This electronic apparatus will be described below with reference to FIG. 42.

FIG. 42 is a diagram for describing a configuration of the electronic apparatus of a third embodiment of the present technology. FIG. 42 illustrates, as an example of the electronic apparatus of the present technology, a configuration diagram of a camera using a solid-state imaging element. The camera of the present embodiment is an example video camera configured to acquire a still image or a video. This camera 700 has a solid-state imaging element 1, an optical system 701 configured to guide incident light to a light receiving sensor of the solid-state imaging element 1, a shutter device 702, a drive circuit 703 configured to drive the solid-state imaging element 1, and a signal processing circuit 704 configured to process an output signal of the solid-state imaging element 1.

The configuration described in each embodiment above is employed for the solid-state imaging element 1. The optical system 701 forms, from image light from an object, an image on an imaging area of the solid-state imaging element 1. In this manner, a signal charge is accumulated in the solid-state imaging element 1 for a certain period of time. Such an optical system 701 may be an optical lens system including a plurality of optical lenses.

The shutter device 702 controls the period of light irradiation and the period of light shielding for the solid-state imaging element 1. The drive circuit 703 supplies the solid-state imaging element 1 and the shutter device 702 with a drive signal, thereby controlling, according to the supplied drive signal such as a timing signal, signal output operation from the solid-state imaging element 1 to the signal processing circuit 704 or shutter operation of the shutter device 702. That is, the drive circuit 703 transfers the signal from the solid-state imaging element 1 to the signal processing circuit 704 by a drive signal supply.

The signal processing circuit 704 performs various types of signal processing for the signal transferred from the solid-state imaging element 1. The video signal subjected to the signal processing is stored in a storage medium such as a memory, or is output and displayed on a monitor.

According to the electronic apparatus of the present embodiment described above, any of the solid-state imaging elements described in the embodiments above and exhibiting favorable light receiving characteristics is used so that high-definition imaging and size reduction can be realized.

Note that the embodiments of the present technology are not limited to the above-described embodiments, and various changes can be made without departing from the gist of the present technology.

Other

The present technology can employ the following configurations.

(1)

A solid-state imaging element including:

a photoelectric converter configured to perform photoelectric conversion of incident light;

a first separator configured to separate the photoelectric converter and formed in a first trench formed from a first surface side; and a second separator configured to separate the photoelectric converter and formed in a second trench formed from a second surface side facing a first surface.

(2)

The solid-state imaging element according to (1), in which in the first trench, a first impurity layer formed of an N-type impurity and a second impurity layer formed of a P-type impurity are formed by solid-phase diffusion.

(3)

The solid-state imaging element according to (1) or (2), in which the first separator and the second separator are arranged next to each other in a direction parallel to an optical axis of a lens through which light enters the photoelectric converter.

(4)

The solid-state imaging element according to (1), (2) or (3) in which the photoelectric converter includes photoelectric converters in two tiers, the photoelectric converter on the first surface side being separated by the first separator and the photoelectric converter on the second surface side being separated by the second separator.

(5)

The solid-state imaging element according to any of (1) to (4), in which a periphery of a block including 2×2 photoelectric converters is separated by the first separator.

(6)

The solid-state imaging element according to any of (1) to (5), in which the first separator and the second separator are arranged next to each other in a direction perpendicular to an optical axis of a lens through which light enters the photoelectric converter.

(7)
The solid-state imaging element according to any of (1) to (6), in which
in the first trench, a first impurity layer formed of an N-type impurity, a second impurity layer formed of a P-type impurity, and a thermally-oxidized film are formed.

(8)
The solid-state imaging element according to any of (1) to (7), in which
a wiring layer is disposed on the first surface side of a semiconductor layer having the photoelectric converter, the first separator, and the second separator, and an optical layer is disposed on the second surface side.

(9)
A method for manufacturing a solid-state imaging element, including:
a step of forming a first trench from a first surface side;
a step of forming, in the first trench, a first separator for separating a photoelectric converter;
a step of forming a second trench from a second surface side facing a first surface; and
a step of forming, in the second trench, a second separator for separating the photoelectric converter.

(10)
An electronic apparatus including:
a solid-state imaging element configured to acquire an image of an object; and
a signal processor configured to process an image signal output from the solid-state imaging element,
in which the solid-state imaging element includes
a photoelectric converter configured to perform photoelectric conversion of incident light,
a first separator configured to separate the photoelectric converter and formed in a first trench formed from a first surface side, and
a second separator configured to separate the photoelectric converter and formed in a second trench formed from a second surface side facing a first surface.

(11)
A solid-state imaging element including:
a photoelectric converter configured to perform photoelectric conversion of incident light; and
a separator configured to separate the photoelectric converter,
in which the separator includes
N-type and P-type impurity layers formed in a trench for separating the photoelectric converter, and
a thermally-oxidized film formed on the impurity layers.

(12)
The solid-state imaging element according to (11), in which
the impurity layers are formed by solid-phase diffusion.

(13)
The solid-state imaging element according to (11) or (12), in which
the N-type impurity layer is formed only on a transfer gate side in the trench, and is not formed on an opposite side of the transfer gate.

(14)
The solid-state imaging element according to (11), (12) or (13), in which
an embedded film to which a predetermined voltage is to be applied is embedded in the trench.

(15)
The solid-state imaging element according to any of (11) to (14), in which a fixed charge film with a negative fixed charge is formed on the thermally-oxidized film.

(16)
The solid-state imaging element according to any of (11) to (15), in which
the separator is formed surrounding a periphery of a pixel.

(17)
The solid-state imaging element according to any of (11) to (16), in which
the trench is formed from a first surface side of a semiconductor layer having the photoelectric converter and the separator, a wiring layer being disposed on the first surface side, and
an optical layer is disposed on a second surface side facing a first surface.

(18)
The solid-state imaging element according to any of (11) to (17), in which
the impurity layers are formed by tilt ion implantation, plasma doping, epitaxial growth, or vapor-phase diffusion.

REFERENCE SIGNS LIST

1 Individual imaging element
3 Pixel
51 Individual imaging element
61 FDTI
62 RDTI
63 N-type impurity layer
64 P-type impurity layer
65 Photodiode
67 Lens
310 FDTI
311 Photodiode
312 Trench
321 N-type impurity layer
332 P-type impurity layer
324 Thermally-oxidized film
325 Embedded film

The invention claimed is:

1. A light detecting device, comprising:
a silicon substrate including a plurality of photoelectric conversion regions, the plurality of photoelectric conversion regions including a first photoelectric conversion region and a second photoelectric conversion region;
a pixel separation region disposed between the first photoelectric conversion region and the second photoelectric conversion region in a cross-sectional view; and
a shallow trench isolation disposed adjacent to the pixel separation region in the cross-sectional view,
wherein the pixel separation region includes a first layer including polysilicon, a second layer including silicon oxide and a third layer including a P-type impurity,
wherein, in the cross-sectional view, the first layer, the second layer, the third layer, and the shallow trench isolation are arranged in this order in a first direction, and
wherein the first direction is parallel to a light receiving plane of the silicon substrate in the cross-sectional view.

2. The light detecting device according to claim 1, wherein the pixel separation region includes a first pixel separation region and a second pixel separation region.

3. The light detecting device according to claim 2, wherein the first pixel separation region extends to a light receiving surface of the silicon substrate, and the second pixel separation region extends to a surface of the silicon substrate opposite the light receiving surface of the silicon substrate.

4. The light detecting device according to claim 3, wherein the first pixel separation region is connected to the second pixel separation region.

5. The light detecting device according to claim 1, wherein the shallow trench isolation extends to a surface of the silicon substrate opposite a light receiving surface of the silicon substrate.

6. The light detecting device according to claim 1, wherein the second layer is greater than or equal to 2 nm and less than or equal to 20 nm.

7. The light detecting device according to claim 1, wherein, in the cross-sectional view, a depth of the pixel separation region is greater than a depth of the shallow trench isolation.

8. The light detecting device according to claim 1, wherein the polysilicon of the first layer has a conductivity.

9. The light detecting device according to claim 1, wherein the polysilicon of the first layer is connected to a contact.

10. The light detecting device according to claim 9, wherein the polysilicon of the first layer receives a potential from the contact.

11. The light detecting device according to claim 1, wherein the polysilicon of the first layer has a first conductivity type with an impurity concentration greater than or equal to 1e16/cm3 and less than or equal to 1e23/cm3.

12. The light detecting device according to claim 1, wherein the pixel separation region further comprises a fourth layer including an N-type impurity.

13. The light detecting device according to claim 12, wherein, in the cross-sectional view, the first layer, the second layer, the third layer, and the fourth layer are arranged successively in the first direction.

14. The light detecting device according to claim 1, further comprising a wiring layer, a color filter, and a plurality of lenses, wherein the wiring layer is disposed on a surface of the silicon substrate opposite a light receiving surface of the silicon substrate, and the color filter and the plurality of lenses are disposed on the light receiving surface of the silicon substrate.

15. The light detecting device according to claim 1, wherein the first photoelectric conversion region and the second photoelectric conversion region are electrically connected to a floating diffusion region.

16. The light detecting device according to claim 15, wherein the floating diffusion region is disposed between the first photoelectric conversion region and the second photoelectric conversion region in a plan view.

17. An electronic apparatus, comprising:
a light detecting device configured to detect light; and
a signal processor configured to process a signal output from the light detecting device,
wherein the light detecting device includes:
a silicon substrate including a plurality of photoelectric conversion regions, the plurality of photoelectric conversion regions including a first photoelectric conversion region and a second photoelectric conversion region;
a pixel separation region disposed between the first photoelectric conversion region and the second photoelectric conversion region in a cross-sectional view; and
a shallow trench isolation disposed adjacent to the pixel separation region in the cross-sectional view,
wherein the pixel separation region extends to a surface of the silicon substrate opposite a light receiving surface of the silicon substrate,
wherein the pixel separation region includes a first layer including polysilicon, a second layer including silicon oxide and a third layer including a P-type impurity,
wherein, in the cross-sectional view, the first layer, the second layer, the third layer, and the shallow trench isolation are arranged in this order in a first direction, and
wherein the first direction is parallel to a light receiving plane of the silicon substrate in the cross-sectional view.

18. The electronic apparatus according to claim 17, wherein the polysilicon of the first layer has a first conductivity type with an impurity concentration greater than or equal to 1e16/cm3 and less than or equal to 1e23/cm3.

19. The electronic apparatus according to claim 17, wherein the pixel separation region further comprises a fourth layer including an N-type impurity.

20. A light detecting device, comprising:
a substrate including a plurality of photoelectric conversion regions;
a plurality of separation regions separating the plurality of photoelectric conversion regions,
wherein each of the separation regions in the plurality of separation regions includes a polysilicon layer a silicon oxide layer and a P-type impurity layer; and
a shallow trench isolation disposed adjacent to each of the separation regions in the plurality of separation regions in a cross-sectional view,
wherein in the cross-sectional view, the polysilicon layer, the silicon oxide layer, the P-type impurity layer, and the shallow trench isolation are arranged in this order in a first direction, and
wherein the first direction is parallel to a light receiving plane of the substrate in the cross-sectional view.

* * * * *